United States Patent
Bijnen et al.

(10) Patent No.: US 11,803,130 B2
(45) Date of Patent: Oct. 31, 2023

(54) PHASE MODULATORS IN ALIGNMENT TO DECREASE MARK SIZE

(71) Applicants: ASML Netherlands B.V., Veldhoven (NL); ASML Holding N.V., Veldhoven (NL)

(72) Inventors: Franciscus Godefridus Casper Bijnen, Valkenswaard (NL); Muhsin Eralp, Bethel, CT (US); Simon Reinald Huisman, Eindhoven (NL); Arie Jeffrey Den Boef, Waalre (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 9 days.

(21) Appl. No.: 17/633,884

(22) PCT Filed: Aug. 5, 2020

(86) PCT No.: PCT/EP2020/072054
§ 371 (c)(1),
(2) Date: Feb. 8, 2022

(87) PCT Pub. No.: WO2021/028292
PCT Pub. Date: Feb. 18, 2021

(65) Prior Publication Data
US 2022/0397833 A1    Dec. 15, 2022

Related U.S. Application Data

(60) Provisional application No. 62/884,702, filed on Aug. 9, 2019.

(51) Int. Cl.
*G03F 9/00* (2006.01)

(52) U.S. Cl.
CPC .......... *G03F 9/7049* (2013.01); *G03F 9/7069* (2013.01); *G03F 9/7088* (2013.01)

(58) Field of Classification Search
CPC ..... G03F 9/7049; G03F 9/7069; G03F 9/7088
See application file for complete search history.

(56) References Cited

U.S. PATENT DOCUMENTS

| | | | |
|---|---|---|---|
| 5,171,999 A | 12/1992 | Komatsu et al. | |
| 5,559,598 A | 9/1996 | Matsumoto | |

(Continued)

FOREIGN PATENT DOCUMENTS

| | | |
|---|---|---|
| CN | 1967316 A | 5/2007 |
| CN | 110095880 A | 8/2019 |

(Continued)

OTHER PUBLICATIONS

Antoine Monmayrant et al., "PhD Tutorial; A newcomer's guide to ultrashort pulse shaping and characterization," Journal of Physics B, Atomic Molecular and Optical Physics, Institute of Physics Publishing, Bristol, GB, vol. 43, No. 10, May 28, 2010 (May 28, 2010), p. 103001, XP020173516, ISSN: 0953-4075.

(Continued)

*Primary Examiner* — Peter B Kim
(74) *Attorney, Agent, or Firm* — Sterne, Kessler, Goldstein & Fox P.L.L.C.

(57) ABSTRACT

An alignment apparatus includes an illumination system configured to direct one or more illumination beams towards an alignment target and receive the diffracted beams from the alignment target. The alignment apparatus also includes a self-referencing Interferometer configured to generate two diffraction sub-beams, wherein the two diffraction sub-beams are orthogonally polarized, rotated 180 degrees with respect to each other around an alignment axis, and spatially overlapped. The alignment apparatus further includes a (Continued)

beam analyzer configured to generate interference between the overlapped components of the diffraction sub-beams and produce two orthogonally polarized optical branches, and a detection system configured to determine a position of the alignment target based on light intensity measurement of the optical branches, wherein the measured light intensity is temporally modulated by a phase modulator.

20 Claims, 17 Drawing Sheets

(56) References Cited

U.S. PATENT DOCUMENTS

| | | | |
|---|---|---|---|
| 5,946,128 | A | 8/1999 | Paek |
| 6,288,831 | B1 | 9/2001 | Iizuka |
| 6,297,876 | B1 | 10/2001 | Bornebroek |
| 6,628,406 | B1 | 9/2003 | Kreuzer |
| 6,961,116 | B2 | 11/2005 | Den Boef et al. |
| 7,511,799 | B2 | 3/2009 | Tel et al. |
| 8,208,121 | B2 | 6/2012 | Bijnen et al. |
| 9,970,747 | B2 | 5/2018 | Kreuzer et al. |
| 10,422,508 | B2 | 9/2019 | Hill et al. |
| 10,585,363 | B2 | 3/2020 | Mathijssen et al. |
| 2004/0101237 | A1 | 5/2004 | Cao |
| 2005/0078296 | A1 | 4/2005 | Bonnet |
| 2008/0043212 | A1 | 2/2008 | Shibazaki |
| 2009/0051899 | A1 | 2/2009 | Harlander et al. |
| 2012/0200838 | A1 | 8/2012 | De Winter et al. |
| 2012/0262612 | A1 | 10/2012 | Zou et al. |
| 2015/0083698 | A1 | 3/2015 | Hua et al. |
| 2015/0227061 | A1* | 8/2015 | Tinnemans ........... G03F 9/7069 356/509 |
| 2017/0160075 | A1 | 6/2017 | Kreuzer et al. |
| 2017/0350575 | A1 | 12/2017 | Hill et al. |
| 2018/0149987 | A1 | 5/2018 | Mathijssen et al. |
| 2018/0341105 | A1 | 11/2018 | Sobolev |
| 2019/0049866 | A1 | 2/2019 | Huisman et al. |
| 2019/0212658 | A1 | 7/2019 | Huisman et al. |
| 2022/0299751 | A1 | 9/2022 | Den Boef et al. |

FOREIGN PATENT DOCUMENTS

| | | |
|---|---|---|
| EP | 0823667 A2 | 2/1998 |
| JP | H01-145621 A | 6/1989 |
| JP | H05-203412 A | 8/1993 |
| JP | H06-082215 A | 3/1994 |
| JP | H07-161611 A | 6/1995 |
| JP | H07-208923 A | 8/1995 |
| JP | H08-5329 A | 1/1996 |
| JP | 2001-013474 A | 1/2001 |
| JP | 2002-372407 A | 12/2002 |
| JP | 2018-517933 A | 7/2018 |
| JP | 2019-516126 A | 6/2019 |
| TW | 201820057 A | 6/2018 |
| WO | WO 02/06899 A2 | 1/2002 |
| WO | WO 2017/125352 | 7/2017 |
| WO | WO 2021/028292 A1 | 2/2021 |

OTHER PUBLICATIONS

Dossou, "Doppler shift generated by a moving diffraction grating under incidence by polychromatic diffuse light," Centre for Ultrahigh-Bandwidth Devices for Optical Systems (CUDOS) and School of Mathematical and Physical Sciences, University of Technology, Sydney, PO Box 123, Broadway, New South Wales 2007, Australia.

Guangya Zhou et al, "MEMS gratings for nondispersive optical phase modulation," IEEE 21st International Conference on Micro Electro Mechanical Systems, 2008: MEMS 2008; Jan. 13-17, 2008, Tucson, Arizona, USA, Piscataway, NJ : IEEE Operations Center, Jan. 1, 2008 (Jan. 1, 2008), pp. 136-139, XP031210701, DOI: 10.1109/MEMSYS.2008.4443611, ISBN: 978-1-4244-1792-6.

International Search Report and Written Opinion of the International Searching Authority directed to related International Patent Application No. PCT/EP2020/072054, dated Dec. 11, 2020; 11 pages.

International Preliminary Report on Patentability directed to related International Patent Application No. PCT/EP2020/072054, dated Feb. 8, 2022; 8 pages.

International Search Report and Written Opinion of the International Searching Authority directed to related International Patent Application No. PCT/EP2020/071083, dated Oct. 19, 2020; 10 pages.

International Preliminary Report on Patentability directed to related International Patent Application No. PCT/EP2020/071083, dated Feb. 8, 2022; 7 pages.

Martin Eckstein et al, "Alignment and characterization of the two-stage time delay compensating XUV monochromator," arxiv.org, Cornell University Library, 201, Olin Library Cornell University, Ihaca, NY, 14853, Apr. 10, 2016 (Apr. 10, 2016), XP080694437.

Matthias Hofer et al, "Manipulating the transmission matrix of scattering media for nonlinear imaging beyond the memory effect," Optics Letters, Jan. 1, 2019 (Jan. 1, 2019), p. 2137, XP55734293, DOI: 10.1364/ao.XX.XXXXXX, Retrieved from the Internet: URL:https://opus.lib.uts.edu.au/bitstream/10453/47675/1/Dossou_AO_2016_preprint.pdf.

Roth et al., "Acousto-optical shaping of ultraviolet femtosecond pulses," Applied Physics B, vol. 80, Mar. 7, 2005; 4 pages.

* cited by examiner

PHASE MODULATORS IN ALIGNMENT TO DECREASE MARK SIZE

CROSS-REFERENCE TO RELATED APPLICATIONS

This application claims priority of U.S. application 62/884,702 which was filed on Aug. 9, 2019 and which is incorporated herein in its entirety by reference.

FIELD

The present disclosure relates to alignment apparatuses and systems, for example, alignment sensor apparatuses for lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error. Accordingly, there is a need for a system and method to provide alignment with high accuracy and less variation.

SUMMARY

Embodiments of alignment apparatuses are described in the present disclosure.

According to some embodiments of the present disclosure, an alignment apparatus includes an illumination system configured to produce an illumination beam, direct the illumination beam towards an alignment target and receive diffraction beams reflected from the alignment target, wherein the diffraction beams comprise at least one positive diffraction order or one negative diffraction order. The alignment apparatus also includes a self-referencing interferometer configured to receive the diffraction beams, generate diffraction sub-beams, wherein the diffraction sub-beams are orthogonally polarized, rotated 180 degrees with respect to each other around an alignment axis, and spatially overlapped. The alignment apparatus further includes a beam analyzer configured to generate interference intensity between the overlapped components of the diffraction sub-beams and produce two orthogonally polarized optical branches. The alignment apparatus also includes a detection system configured to determine a position of the alignment target based on light intensity measurement of the optical branches, wherein the measured light intensity is modulated by a phase modulator.

In some embodiments, the illumination system is further configured to produce off-axis illumination beams at first and second positions diametrically opposite to one another in a pupil plane. In some embodiments, the off-axis illumination beam is modulated by the phase modulator.

In some embodiments, the phase modulator modulates the positive or negative diffraction order of the diffraction beams reflected from the alignment target.

In some embodiments, the phase modulator modulates the diffraction sub-beams generated by the self-referencing interferometer.

In some embodiments, the phase modulator modulates the optical branches produced by the beam analyzer.

In some embodiments, the phase modulator modulates an image of the alignment target at an input to the detection system.

In some embodiments, the phase modulator is a piezo-electric minor assembly that produces phase modulation by applying an electric signal on a piezoelectric material.

In some embodiments, the phase modulator comprises a liquid crystal modulator, a photo-elastic modulator, an electro-optic modulator, a ferroelectric liquid crystal, a micro mirror array or a digitized spatial light modulator. In some embodiments, the liquid crystal modulator is a potassium dideuterium phosphate (KD*P) crystal.

In some embodiments, the phase modulator is a waveplate covering half of the pupil plane to change polarization states of the positive and negative diffraction orders.

In some embodiments, the phase modulator comprises a transmissive and a deflective region, wherein each region comprises two diametrically opposite quadrants, and the deflective region is wedge shaped with a varying thickness.

In some embodiments, the phase modulator produces frequency modulation of an off-axis illumination beam. In some embodiments, the phase modulator is an acousto-optic modulator. In some embodiments, the phase modulator is an internal grating and the frequency modulation of the off-axis illumination beam is produced by scanning the internal grating. In some embodiments, the phase modulator is a half-wave plate and the frequency modulation of the off-axis illumination beam is produced by rotating the half-wave plate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
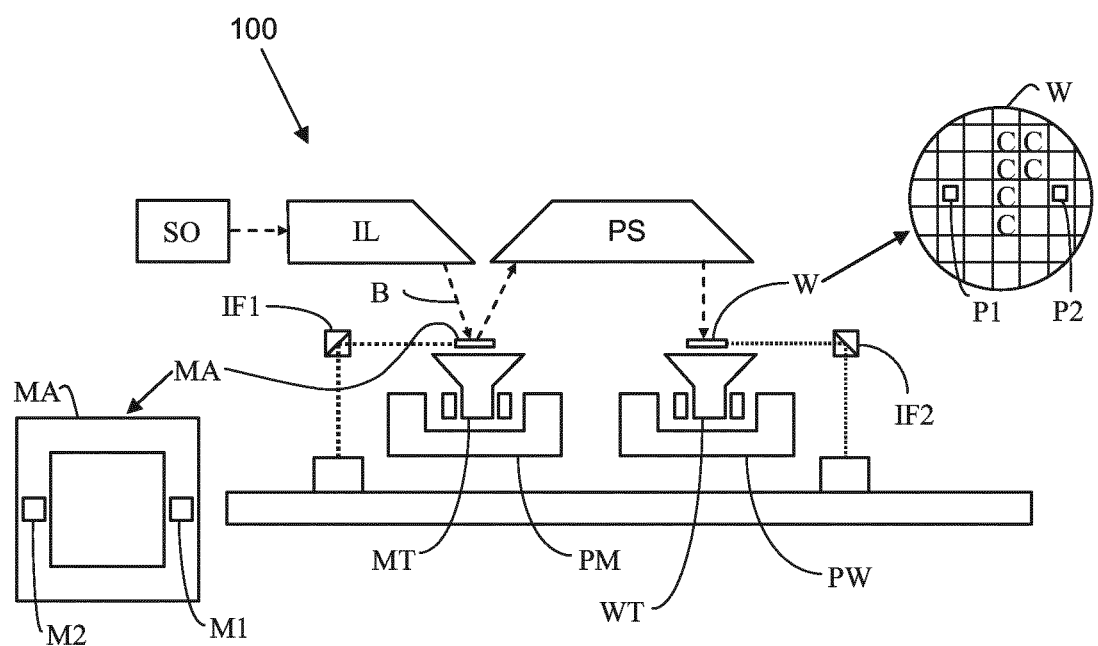
FIG. 1A is a schematic illustration of a reflective lithographic apparatus, according to an exemplary embodiment.

FIGS. 10A, 10B, 10C, 11A, 11B, 12A, 12B, 13, 14A, 14B, 15A, 15B, and 16 illustrate exemplary optical configurations for phase modulation, according to some embodiments of present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative Willis are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the flit aware, software, routines, instructions, etc.

Before describing such embodiments in more detail, however, it is instructive to present an example environment in which embodiments of the present disclosure may be implemented.

Example Lithographic Systems

Figure 1B:
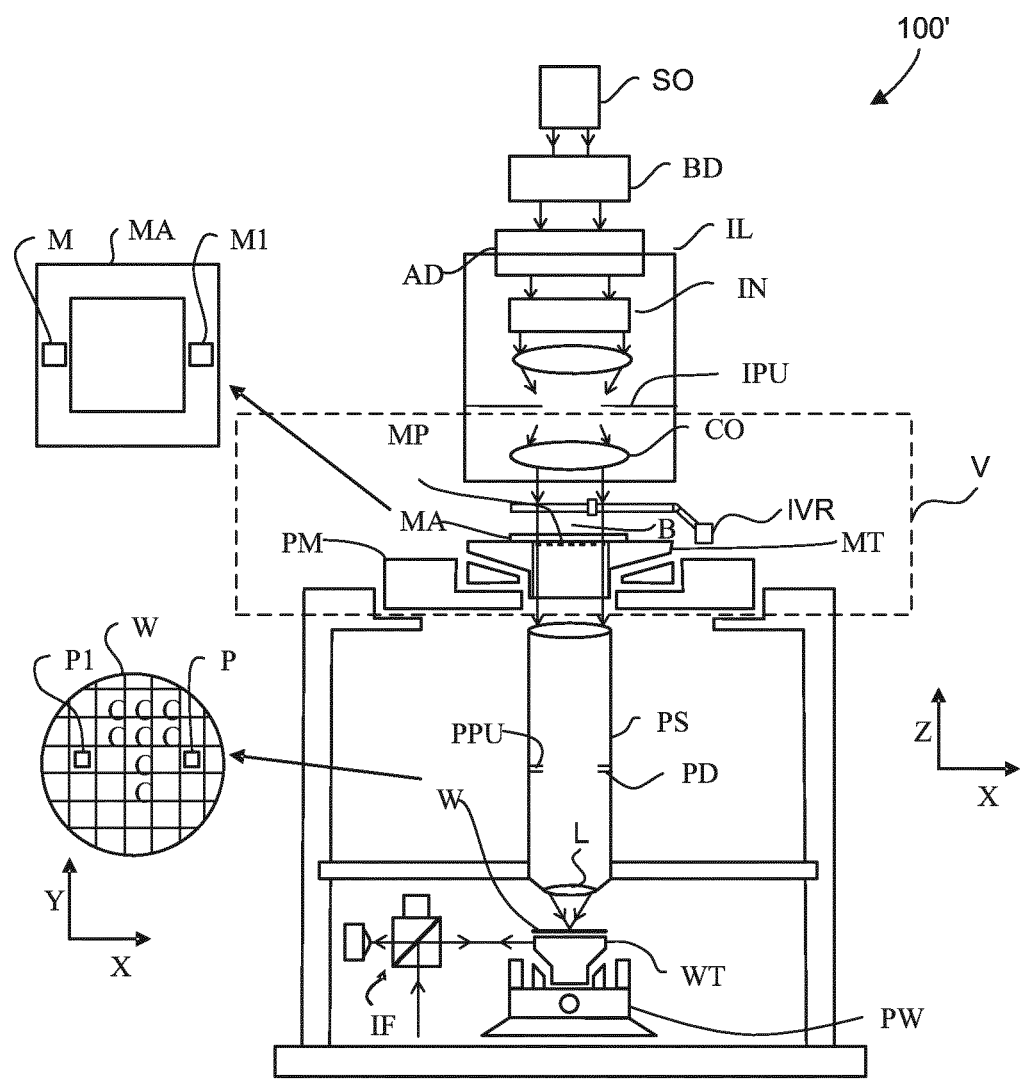
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror allay employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device, Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines, Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern. MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
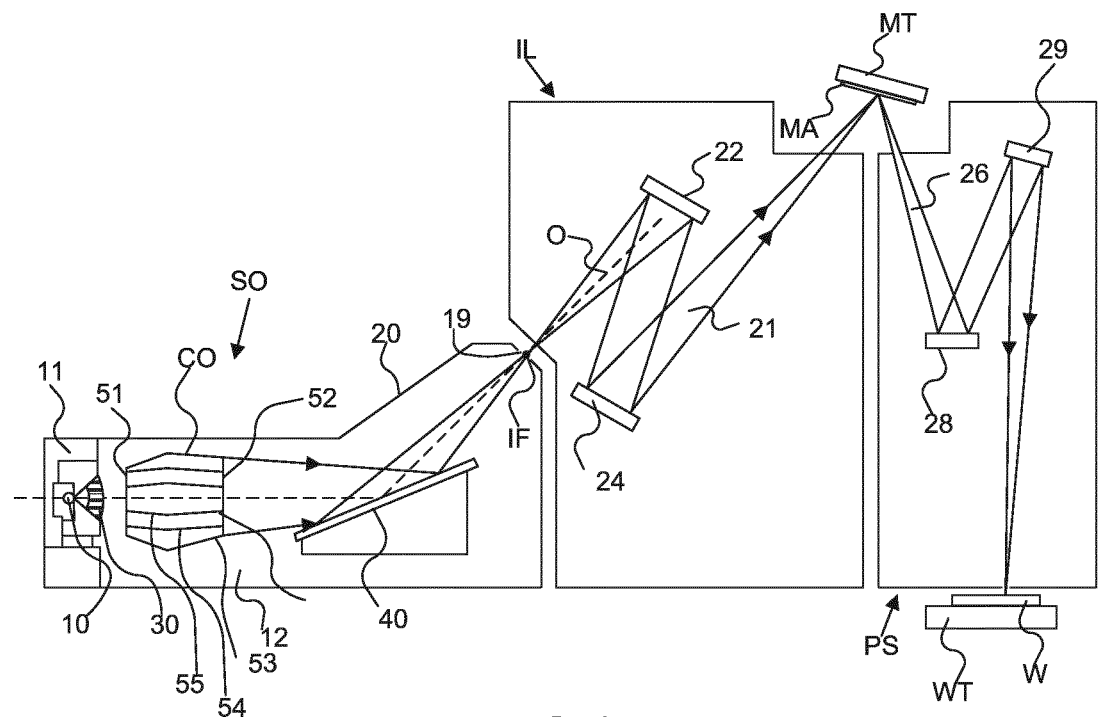
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system. IL, and the projection system PS. The source collector apparatus SO is constructed and arranged such that a vacuum environment can be maintained in an enclosing structure 20. The source collector apparatus SO includes a source chamber 11 and a collector chamber 12 and is configured to produce and transmit an EUV radiation. EUV radiation may be produced by a gas or vapor, for example Xe gas, Li vapor, or Sn vapor in which an EUV radiation emitting plasma 10 is created to emit radiation in the EUV range of the electromagnetic spectrum. The EUV radiation emitting plasma 10, at least partially ionized, can be created by, for example, an electrical discharge or a laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the EUV radiation emitting 10 is passed from the source chamber 11 into the collector chamber 12 via an optional gas barrier or contaminant trap 30 (in some cases also referred to as contaminant barrier or foil trap), which is positioned in or behind an opening in source chamber 11. The contaminant trap 30 may include a channel structure. Contamination trap 30 may also include a gas barrier or a combination of a gas barrier and a channel structure. The contaminant trap or contaminant barrier 30 further indicated herein at least includes a channel structure.

The collector chamber 12 may include a radiation collector CO, which can be a so-called grazing incidence collector. Radiation collector CO has an upstream radiation collector side 51 and a downstream radiation collector side 52. Radiation that traverses collector CO can be reflected off a grating spectral filter 40 to be focused in a virtual source point IF. The virtual source point IF is commonly referred to as the intermediate focus, and the source collector apparatus is arranged such that the intermediate focus IF is located at or near an opening 19 in the enclosing structure 20. The virtual source point IF is an image of the radiation emitting plasma 10. Grating spectral filter 40 is used in particular for suppressing infra-red (IR) radiation.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 29 onto a substrate W held by the wafer stage or substrate table WT.

More elements than shown may generally be present in illumination optics unit IL and projection system PS. The grating spectral filter 40 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 53, 54, and 55, just as an example of a collector (or collector mirror). The grazing incidence reflectors 53, 54, and 55 are disposed axially symmetric around an optical axis O and a collector optic CO of this type is preferably used in combination with a discharge produced plasma source, often called a DPP source.

Exemplary Lithographic Cell

Figure 3:
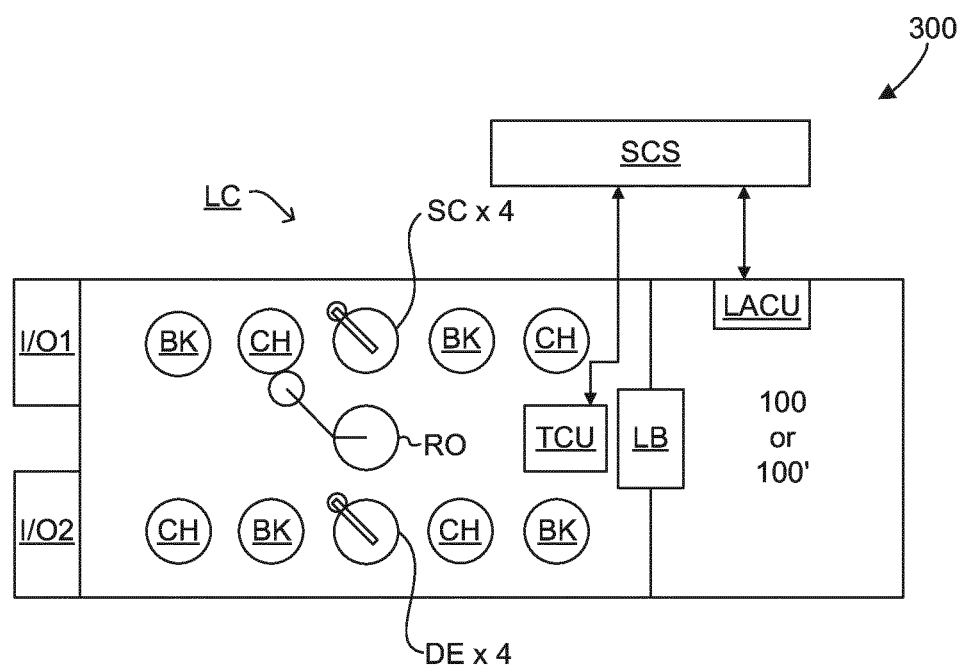
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus using Interference

In order to control the lithographic process to place device features accurately on the substrate, alignment "marks" or "targets" are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.) and U.S. Pat. No. 6,628,406 (Kreuzer). Generally marks are measured separately to obtain X- and Y-positions. A combined X- and Y-measurement can be performed using the techniques described in U.S. Pat. No. 8,208,121 (Bijnen et al.) The full contents of these disclosures are incorporated herein by reference.

Figure 4:
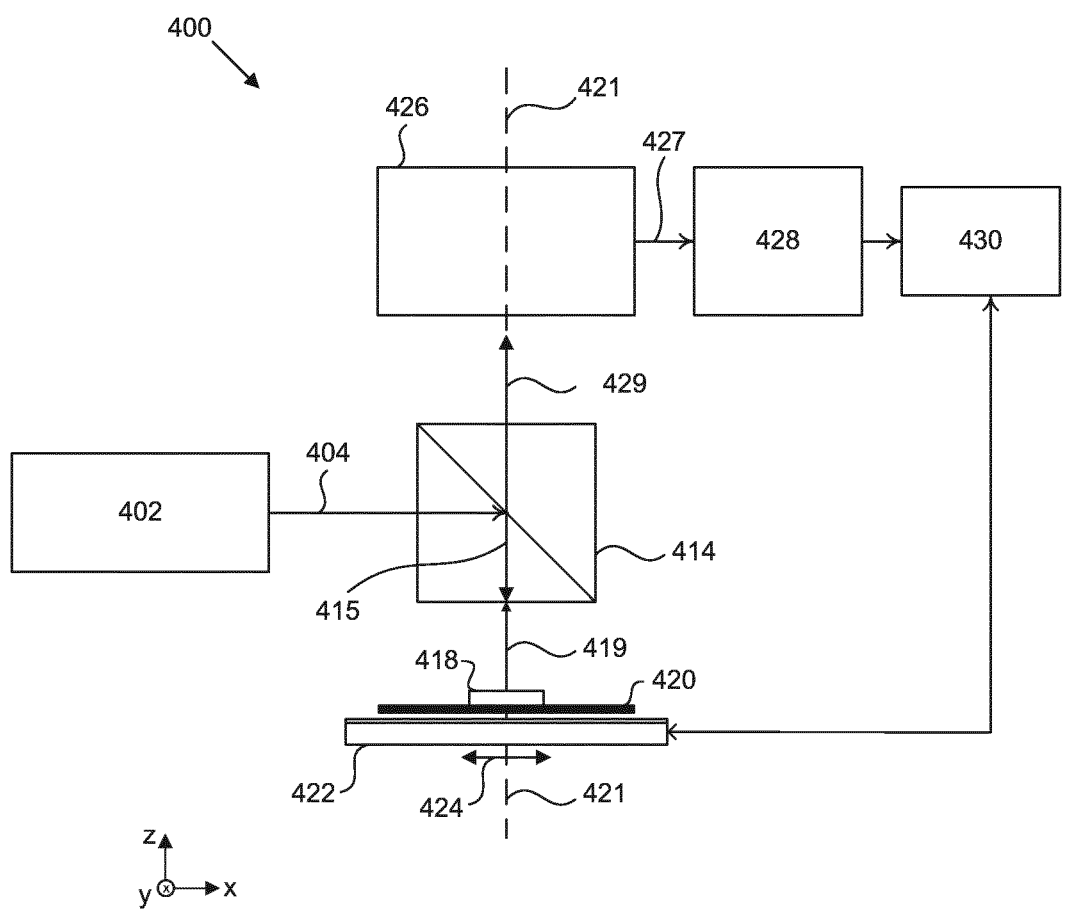
FIG. 4 is a schematic illustration of an alignment apparatus, according to an exemplary embodiment.

FIG. 4 illustrates a schematic of a cross-sectional view of an alignment apparatus 400 that can be implemented as a part of lithographic apparatus 100 or 100', according to an embodiment. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

According to an embodiment, alignment apparatus 400 may include an illumination system 402, a beam splitter 414, an interferometer 426, a detector 428, and a signal analyzer 430, according to an example of this embodiment. Illumination system 402 may be configured to provide an electromagnetic narrow band radiation beam 404 having one or more passbands. In an example, the one or more passbands may be within a spectrum of wavelengths between about 400 nm to about 2.0 µm. In another example, the one or more passbands may be discrete narrow passbands within a spectrum of wavelengths between about 400 nm to about 2.0 µm.

Beam splitter 414 may be configured to receive radiation beam 404 and direct a radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate.

Beam splitter 414 may be further configured to receive diffraction radiation beam 419 and direct diffracted radiation sub-beam 429 towards interferometer 426, according to an embodiment.

In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. Interferometer 426 may be further configured to rotate one of the two images with respect to the other of the two images 180° and recombine the rotated and unrotated images interferometrically. In some embodiments, the interferometer 426 can be a self-referencing interferometer, which is disclosed in U.S. Pat. No. 6,628,406 (Kreuzer) and is incorporated by reference herein in its entirety.

In an embodiment, detector 428 may be configured to receive the recombined image via interferometer signal 427 and detect interference as a result of the recombined image when an alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties.

In an embodiment, signal analyzer 430 may be configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422.

In some embodiments, detector 428 can be an array of detectors, allowing the possibility of accurate stack profile detection. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Alignment Marks and Diffraction Gratings

Figure 5A:
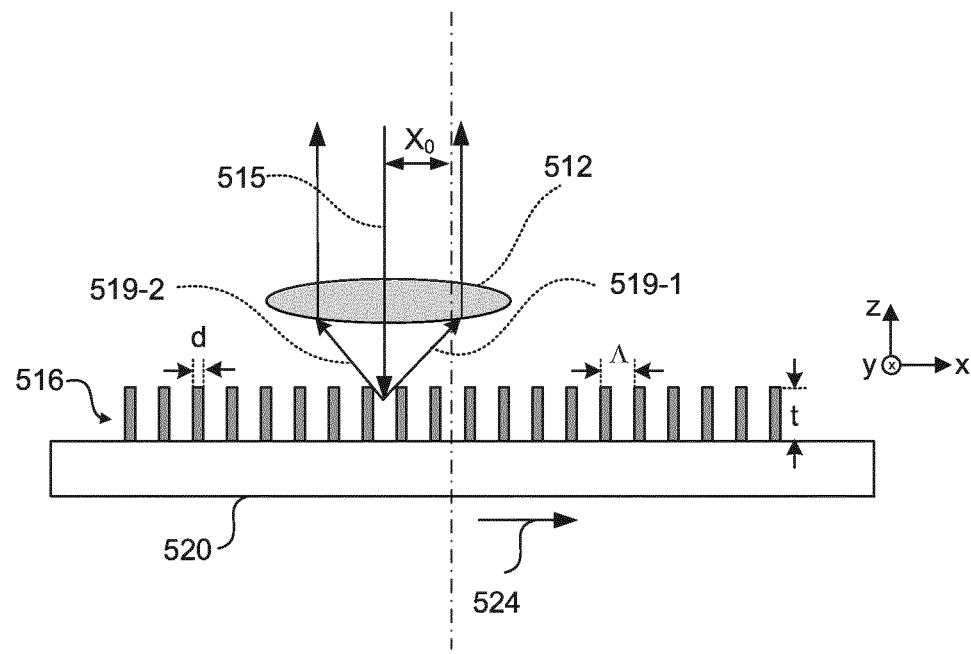
FIGS. 5A and 5B illustrate exemplary alignment targets designed with diffraction gratings, according to some embodiments of present disclosure.

FIG. 5A shows a cross-sectional view of a diffraction grating 516, according to an embodiment. Diffraction grating 516 can include a pitch or period of "Λ" and a grating line width of "d", (boned on a substrate 520. The efficiency of high diffraction orders can be determined by parameters of diffraction grating 516, such as profile of the grating structure (e.g., rectangular shape), film stack thickness "t", duty cycle "F", etc. Duty cycle "F" can be defined as a ratio of grating width d and pitch Λ, i.e., F=d/Λ. Diffraction efficiency can be predicted using rigorous vector wave modeling or various other methods to solve Maxwell's equations which fully describe the electromagnetic fields as light propagates.

In one example, the spectral property (e.g., diffraction angles) of diffraction grating 516 can be described by a grating equation. For example, at normal incidence with a radiation beam 515 having a wavelength of λ, diffraction angle $\vartheta_m$ of mth order can be predicted by $$\Lambda \sin(\vartheta_m) = m\lambda \text{(normal incidence)} \quad (1)$$

and with an incident angle at $\vartheta_0$, diffraction equation (1) can be modified as $$\Lambda(\sin(\vartheta_m) - \sin(\vartheta_0)) = m\lambda \quad (2)$$

Diffraction gratings can be used as alignment marks (also referred to as alignment targets). The operation of an alignment system can be based on the phase shift Δφ between the two symmetric high order diffractions, for example, between diffraction beams 519-1 and 519-2 with m=+1 and m=−1, respectively. When diffraction grating 516 is not moving, frequency ν of diffraction beams 519-1 and 519-2 can be the same, e.g., ν·λ=c, wherein c is the speed of light. In this example, diffraction beams 519-1 and 519-2 are in phase. If diffraction grating 516 or substrate 520 is moving, for example, along a scanning direction 524 relative to an objective lens 512 or an interferometer (not shown) with a speed $V_{stage}$, the frequency of diffraction beam 519-1 can be increased by Δν, while the frequency of diffraction beam 519-2 can be decreased by Δν due to Doppler Effect. The frequency difference can result in a temporal phase shift Δφ(t) when diffraction beams 519-1 and 519-2 arrive at the interferometer, wherein the temporal phase shift Δφ(t) can be expressed as:

$$\Delta\varphi(t) = 2\pi(2\Delta\nu)t = 4\pi \frac{V_{stage}}{\Lambda} t \quad (3)$$

The other higher order diffraction beams follow similar behavior. As such, the light intensity $I_{SUM}$ measured at the output of the interferometer can be a function of a grating offset $x_0$, a shift from a center of the grating.

$$I_{SUM} = I_0 + I_1 \cos\left(\frac{4\pi x_0}{\Lambda} + \Delta\varphi(t)\right) \quad (4)$$

Figure 5B:
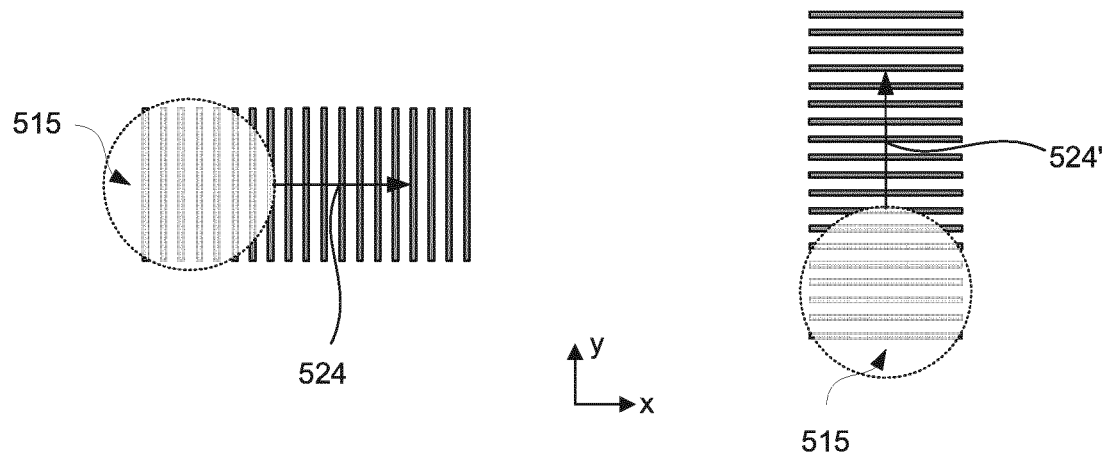

By scanning the grating 516 (shown in top-down view of FIG. 5B), alignment signal can be modulated and presented in the temporal modulation of the light intensity $I_{SUM}$. Through data processing and analysis, noises and other factors can be filtered out and grating offset $x_0$ can be determined by parameter fitting and extraction from the measured light intensity $I_{SUM}$. In FIG. 5B, diffraction grating 516 is oriented either in x or in y direction on the substrate 520. In some embodiments, diffraction grating 516 can be oriented in any other directions on the substrate 520. For example, diffraction grating 516 can have a 45 degree angle with respect to the x-direction (not shown in FIG. 5B).

Even as lithography systems provide smaller and smaller patterning features at advanced technology nodes for integrated circuits, they also need to increase accurate alignment between different lithography levels receiving smaller and smaller alignment marks or targets. Alignment marks can usually be placed in a scribe lane, an area between chips or dies (product areas) that is subsequently thrown away at die dicing before packaging. For a given process monitoring area, smaller size also allows more alignment marks being distributed at various locations to improve alignment and/or overlay uniformity across the wafer. Alternatively, for a die with large area, smaller alignment marks can be placed inside a die to improve alignment across a product chip.

Currently an interference-based alignment system relies on grating scanning to generate modulated alignment signals. FIG. 5B shows alignment marks along x and y directions on the substrate 520, according to some embodiments. The radiation beam 515 can scan across the alignment marks in x-direction and in y-direction. In some embodiments, substrate 520 moves instead of radiation beam 515.

In one example, in order to generate reliable alignment signals, long alignment marks are designed to provide enough distance for the scanning. In an image-based alignment system, small alignment marks can be used. However, resolution and speed may be limited due to large data acquisition and processing.

Exemplary Alignment System Using Active Phase Modulation

Figure 6:
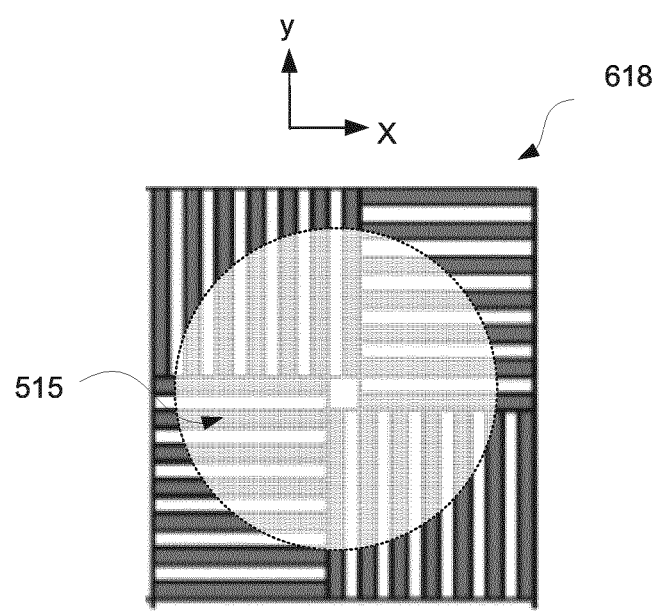
FIG. 6 illustrates an exemplary alignment target designed with two-dimensional diffraction gratings, according to some embodiments of present disclosure.

Various embodiments in accordance with the present disclosure provide apparatus and methods for alignment with small marks by using active phase modulation. For example, alignment marks as small as 5 µm×5 µm can be sufficient to provide alignment signals with good resolution. A top-down view of an exemplary alignment mark or target 618 is illustrated in FIG. 6, where two-dimensional diffraction gratings are arranged in x- and y-directions such that position of the alignment target 618 can be determined without moving radiation beam 515. By using active phase modulation, the alignment signals along x- and y-directions of the alignment target 618 can be measured simultaneously and position of the alignment target 618 in x- and y-directions can be determined simultaneously.

In some embodiments, alignment target 618 can include diffraction gratings oriented in any directions other than x- or y-directions. For example, the diffraction gratings can form a 45 degree angle with respective to x- or y-directions.

In one example, the alignment apparatus and methods require no moving parts and can be operated in static mode. Furthermore, by using phase modulation, alignment signals can be modulated at a frequency less sensitive to the vibrations of the alignment apparatus. As such, alignment using phase modulation can have less background noises compared with alignment using grating scanning.

In some embodiments, when using active phase modulation together with alignment target scanning, counter moving phase can be introduced for high speed scanning and high speed alignment.

Figure 7:
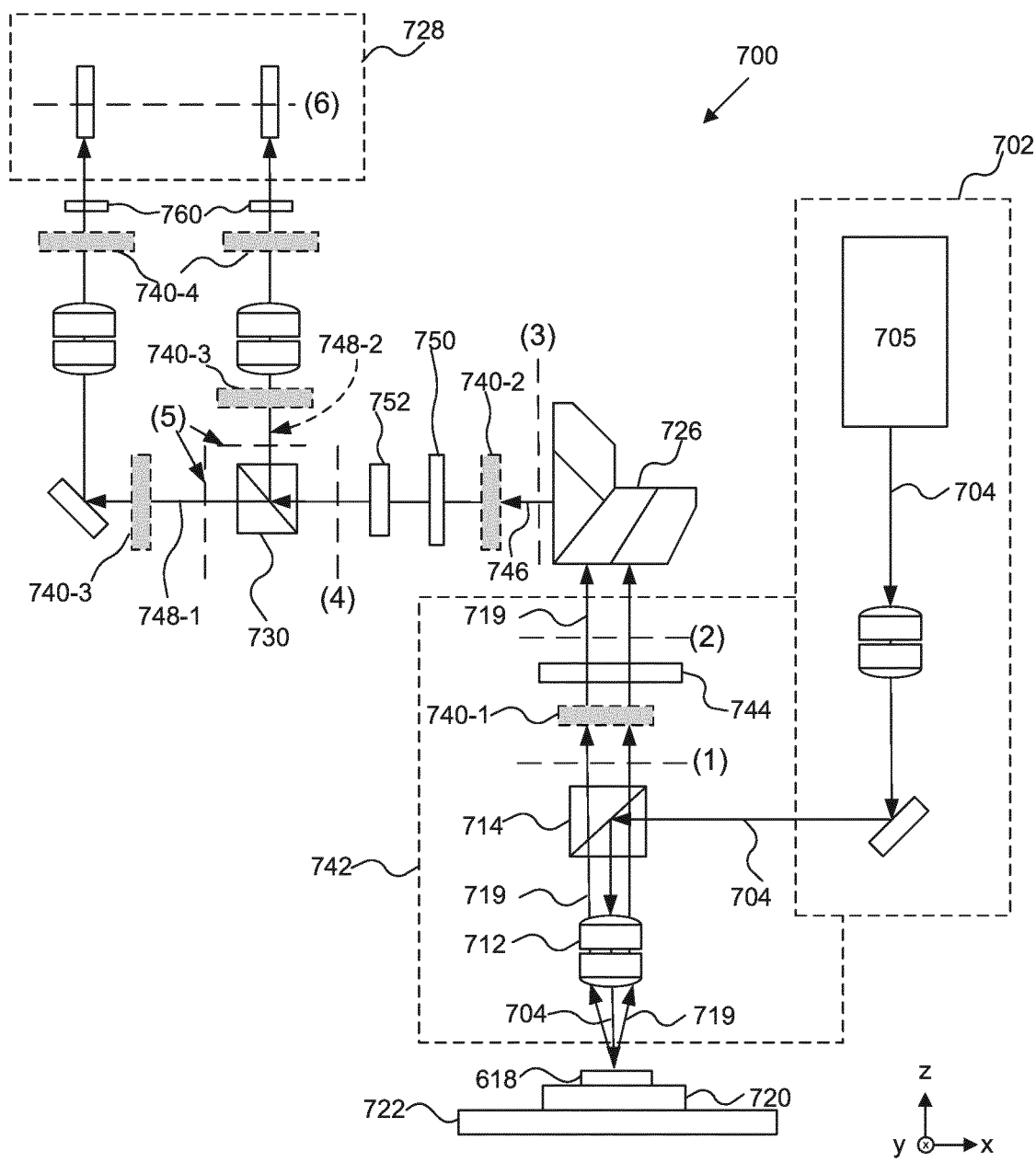
FIG. 7 illustrates exemplary optical configurations for phase modulation in an alignment apparatus, according to some embodiments of present disclosure.
Figure 8:
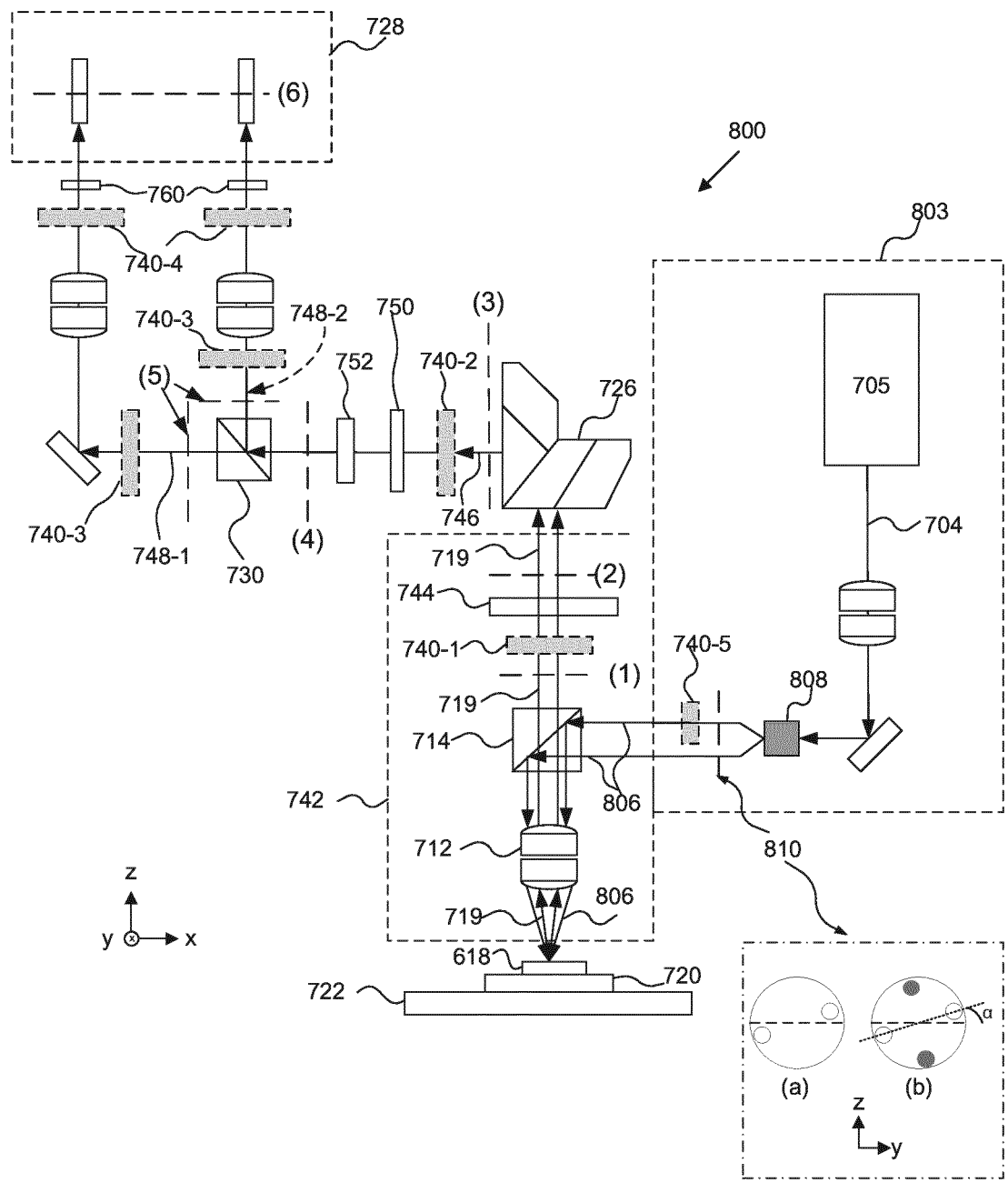
FIG. 8 illustrates another exemplary alignment apparatus, according to some embodiments of present disclosure.

FIGS. 7 and 8 illustrate exemplary alignment apparatuses 700 and 800, according to some embodiments of the present disclosure. Alignment apparatuses 700 and 800 can be configured to measure a position of the alignment target 618 based on phase modulation of diffraction beams 719 (also referred to as diffracted beams), wherein the phase modulation is generated through phase modulators 740 at various locations in the alignment apparatuses 700 or 800. Alignment apparatuses 700 and 800 can be built as a part of lithographic apparatus 100 or 100', or can be built as a stand-alone unit in lithography cell or cluster 300 and work together with other apparatuses during operation. In some embodiments, alignment apparatus 700 includes an illumination system 702 producing an on-axis illumination beam 704, while alignment apparatus 800 includes an illumination system 803 producing off-axis illumination beams 806. The alignment apparatuses 700 and 800 can also include a projection system 742, a self-referencing interferometer (SRI) 726, a beam analyzer 730 and a detection system 728. In some embodiments, the projection system 742 can be part of the illumination system 702 and 803.

In one example, the illumination systems 702 and 803 include a light source 705, where light source 705 emits spatially coherent on-axis illumination beam 704. On-axis illumination beam 704 can have an electromagnetic narrow band with one or more passbands. In some embodiments, the on-axis illumination beam 704 can be visible light or infrared light with a wavelength in a range between about 500 nm to about 700 nm, and about 700 nm to about 2 µm, respectively. In some embodiments, light source 705 can include one or more sources of radiation, each source producing one or more passbands within a spectrum of wavelengths between about 500 nm to about 2 µm. In this example, the on-axis illumination beam 704 can be a combination of the one or more passbands from the one or more sources of radiation and can also have substantially continuous wavelengths. In some embodiments, the wavelength range of the on-axis illumination beam 704 can also include ultra-violet.

In some embodiments, illumination system 803 of alignment apparatus 800 in FIG. 8 includes an off-axis optical assembly 808 and can produce off-axis illumination beams 806 from the on-axis illumination beam 704. For an off-axis illumination, source regions of radiation are confined to a peripheral portion of the pupil, some distance away from optical axis. In some embodiments, off-axis optical assembly 808 can include an axicon mirror, one or more beam splitters or quadruple lenses. Detailed disclosure of off-axis radiation can be found in U.S. Pat. No. 9,970,747 (Kreuzer, et. al.), which is incorporated herein by reference in its entirety.

The off-axis illumination beams 806 can have an illumination profile 810. In some embodiments, illumination profile 810 can include (a) one pair of illumination spots positioned diametrically opposite one another, with a symmetry of 180° about the optical axis, and (b) two pairs of illumination spots with 180° symmetry in each pair. In some embodiments, the two pairs of illumination spots are separated 90° from each other. In some embodiments, illumination spots of the illumination profile 810 are located at an angle α about 22.5° off the y-axis. The circular area of illumination profile 810 in FIG. 8 presents pupil plane of the illumination system 803.

In some embodiments, illumination beam 704 can be a polarized beam, for example, having linear polarization, circular polarization or elliptical polarization. Un-polarized irradiation from light source 705 can be converted to a polarized beam by using a polarizer, such as dichroic, crystalline, or wire grid polarizers. Two orthogonal polarization directions of illumination beam 704 can be described as p-polarization and s-polarization. For example, p-polarization has an electric field parallel to the plane of incidence and s-polarization has an electric field perpendicular to the plane of incidence. In some embodiments, polarization states of illumination beams 806 can be different from the incoming illumination beam 704 by using one or more polarizers.

In some embodiments, projection system 742 of alignment apparatus 700 (in FIG. 7) and alignment apparatus 800 (in FIG. 8) includes an objective lens 712 and a beam splitter 714, and are configured to direct the on-axis illumination beam 704 or off-axis illumination beams 806 towards the alignment target 618 and direct diffraction beams 719 reflected from the alignment target 618 towards the self-referencing interferometer (SRI) 726. In this example, on-axis illumination beam 704 is directed with a normal incident angle towards the alignment target 618, while off-axis illumination beams 806 are directed with a fixed incident angle towards the alignment target 618.

In one example, during the semiconductor manufacturing process, wafers can move beneath the primary lithography lens. How accurately the wafer is positioned under this exposure lens can directly determine the quality of semiconductor products. Therefore, alignment marks can be placed on the wafer starting from the first lithography level to ensure the precision of wafer position. In some embodiments, alignment target 618 can be structures formed on a substrate 720 (e.g. a semiconductor wafer) situated on a stage 722 through pattern transfer using a prior-level lithography mask (not shown). The material and film stack used for the formation of alignment target 618 can depend on the layout of alignment target 618 on the prior-level lithography mask and the processes that the substrate 720 went through. In some embodiments, alignment target 618 can be made of or coated with a radiation sensitive film, for example, photoresist. The design requirement for alignment target 618 (e.g., shape and size) depends on the alignment system and alignment method used.

In the example shown in FIGS. 7 and 8, beam splitter 714 can be a spot mirror, formed by a transmissive cube with a reflective metal layer disposed in the center of the cube. It should be noted that even though beam splitter 714 is shown to reflect illumination beam 704 or 806 towards alignment target 618 and to transmit diffraction beams 719 towards SRI 726, the disclosure is not so limiting. It would be apparent to a person skilled in the relevant art that other optical arrangements may be used to obtain similar result.

In one example, objective lens 712 focuses illumination beams 704 or 806 onto alignment target 618 and collects diffraction beams 719 reflected from alignment target 618. It is known to a person skilled in the art, other focusing optical systems can also be used to provide similar function.

In some embodiments, diffraction beams 719 from alignment target 618 include symmetrically distributed high orders of diffraction beams, i.e., m≠0 in Equation (1) or (2), for example, +1 and −1, +2 and −2, +n and −n, . . . , respectively. Different orders of diffraction beams are spatially separated, depending on the diffraction angle $\vartheta_m$. In some embodiments, diffraction beams 719 include at least one positive diffraction order or one negative diffraction order.

In one example, SRI 726 is configured to receive diffraction beams 719 and produce diffraction sub-beams 746. SRI 726 can project two overlapping images of the alignment target 618 that are relatively rotated by 180°. At SRI 726, as further illustrated in FIG. 9 each pair of positive and negative diffraction orders of the diffraction beams 719 generates two pairs of diffraction sub-beams 746-1 and 746-2, where each pair of the diffraction sub-beams (e.g., 746-1) includes spatially overlapped components from both of the positive and negative diffraction orders of the diffraction beams 719. The details of self-referencing interferometer are disclosed in U.S. Pat. No. 6,961,116 (Boef, et. al.) and U.S. Pat. No. 6,628,406 (Kreuzer), which are incorporated herein by reference in their entireties.

In some embodiments, a first polarizer 744 can be placed between the beam splitter 714 and the SRI 726 to adjust polarization states of the diffraction beams 719 before entering SRI 726. For example, the first polarizer 744 can be a half-wave plate and can rotate polarization directions of the diffraction beams 719.

In some embodiments, a phase compensator 750 and a second polarizer 752 can be implemented between SRI 726 and beam analyzer 730. The phase compensator 750 and the second polarizer 752 can adjust the phase and polarization directions of the diffraction sub-beams 746. In some embodiments, the second polarizer 752 can be a half-wave plate. In some embodiments, the phase compensator or phase retarder 750 can be a birefringent crystal made from materials such as tourmaline, calcite ($CaCoO_3$), sodium nitrate ($NaNO_3$), calomel ($Hg_2Cl_2$) or rutile ($TiO_2$). In some embodiments, the phase compensator 750 can be made from barium borate (αBBO or $BaB_2O_4$). Polarized light along a fast axis of a birefringent crystal encounters a lower index of refraction and travels faster through the crystal than light polarized along a slow axis. Therefore, a phase shift can be generated between lights with different polarization directions.

In some embodiments, beam analyzer 730 can be configured to generate interference intensity between the overlapped components of the diffraction sub-beams 746 and produce two orthogonally polarized optical branches 748. For example, beam analyzer 730 can transmit light with p-polarization and reflect s-polarization. As such, p-polarized components of the diffraction sub-beams 746 can be transmitted to optical branch 748-1 and s-polarized components of the diffraction sub-beams 746 can be reflected to optical branch 748-2. On optical branch 748-2, the s-polarized components of diffraction sub-beams 746 interfere with each other. Likewise, the p-polarized components of diffraction sub-beams 746 also interfere with each other on optical branch 748-1.

In one example, the detection system 728 of alignment apparatuses 700 and 800 in FIG. 7 and FIG. 8 produces incoherent additions of the interference beams and measures the light intensity of each optical branches 748-1 and 748-2. The detection system 728 can be configured to determine a position of the alignment target 618 based on the light intensity measurement of the optical branches 748, where the light intensity is modulated in certain ways in order to extract alignment information among other parameters of the alignment apparatuses.

For a steady alignment apparatus and static alignment target 618 (e.g., stage 722 is not moving), the light intensity measured by the detection system 728 can be expressed $$I_{sum} = 1 + \cos\left(\frac{4\pi x_0}{\Lambda}\right) \quad \text{5(a)}$$

$$I_{diff} = 1 - \cos\left(\frac{4\pi x_0}{\Lambda}\right) \quad \text{5(b)}$$

Equations 5(a) and 5(b) are similar to Equation 4 with the exception that $V_{stage}=0$ and thereby temporal phase shift $\Delta\varphi(t)=0$. However, to extract grating offset $x_0$, light intensity modulation needs to be introduced into Equations 5(a) or 5(b). In contrast to moving stage 722 (or scanning the alignment target) as described in Equations (3) and (4), active phase modulation can be used to obtain light intensity modulation and will be described further in details.

Figure 9:
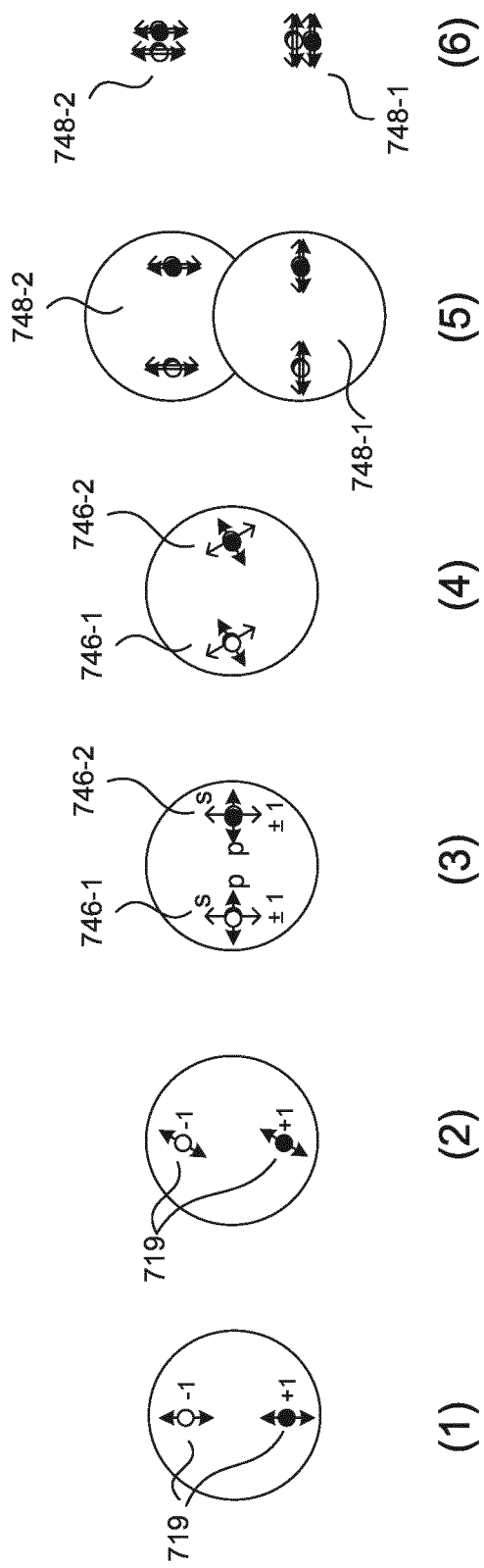
FIG. 9 illustrates polarization states at various locations as light propagating through an alignment apparatus, according to some embodiments of present disclosure.

FIG. 9 illustrates polarization states of diffraction beams 719 at various locations when propagating through alignment apparatuses 700 and 800, according to some embodiments of the present disclosure. In this example, only one pair of diffraction order (e.g., m=+1 and −1) is shown for simplicity. However diffraction beams 719 can also include higher diffraction orders (e.g., m=+2 and −2). In FIG. 9, two linearly polarized diffraction beams from alignment target are illustrated and polarization directions are shown with arrows. Diffraction beams 719 can have other polarization, and are not limited by the examples herein. In FIG. 9, the circular area represents pupil plane of the alignment apparatuses 700 and 800.

In some embodiments, at location (1) between the beam splitter 714 and the first polarizer 744, the pair of positive and negative diffraction orders of the diffraction beams 719 are located diametrically opposite in the pupil plane. At location (2) between the first polarizer 744 and the SRI 726, polarization direction of the positive and negative orders of the diffraction beams 719 are rotated. For example, the first polarizer 744 is a half-wave plate, and the angle of rotation depends on the angle of the fast axis of the half-wave plate.

In one embodiment, when the diffraction beams 719 propagate through SRI 726, each of the positive and negative diffraction orders are split into two diffraction sub-beams 746-1 and 746-2. Each of the diffraction sub-beams 746-1 and 746-2 includes components from both the positive and negative diffraction orders of the diffraction beams 719, spatially overlapping each other, which is represented by superposing +1 and −1 in FIG. 9(3). For example, the diffraction sub-beam 746-1 can have p-polarized component of the positive diffraction order of the diffraction beams 719, and s-polarized component of the negative diffraction order of the diffraction beams 719, spatially overlapping each other. Similarly, the diffraction sub-beam 746-2 can have s-polarized component of the positive diffraction order of the diffraction beams 719, and p-polarized component of the negative diffraction order of the diffraction beams 719, spatially overlapping each other. In some embodiments, the diffraction sub-beams 746-1 and 746-2 are rotated ±90° in the pupil plane from the original position of the positive and negative diffraction orders of the diffraction beams 719. In the other words, the diffraction sub-beams 746-1 and 746-2 are rotated 180° relatively from each other. As such at the output of SRI 726, the diffraction sub-beams 746-1 and 746-2 both carry the alignment information from the positive and negative diffraction orders (e.g., +1 and −1) of the diffraction beams 719.

When the diffraction sub-beams 746-1 and 746-2 propagating through the phase compensator 750, the phase shift between s-polarization and p-polarization can be adjusted. Also, the polarization direction of the diffraction sub-beams 746-1 and 746-2 can be rotated at the second polarizer 752. The resulting polarization states of the diffraction sub-beams 746-1 and 746-2 are shown in FIG. 9(4), corresponding to location (4) in apparatuses 700 and 800.

At location (5) after the beam analyzer 730, each of the diffraction sub-beams 746-1 and 746-2 is split into two optical branches 748-1 and 748-2. For example, diffraction sub-beam 746-1 can have both p- and s-polarization directions rotated 45° at the second polarizer 752. As such at the beam analyzer 730, each of the 45° oriented polarizations can be further decomposed into s-polarization and p-polarization, wherein s-polarization components are reflected into optical branch 748-2 and p-polarization components are transmitted into optical branch 748-1. In some embodiments, the s-polarized components of the diffraction sub-beams 746-1 interfere with each other. Similarly, the p-polarized components of the diffraction sub-beams 746-1 also interfere with each other. The diffraction sub-beams 746-2 behaves similar to the diffraction sub-beams 746-1 described above. Therefore, at location (5) four pairs of interference beams are generated in apparatuses 700 and 800.

At location (6), the detection system 728 produces additions of the interference beams for each optical branches 748-1 and 748-2 and outputs light intensities as $I_{diff}$ and $I_{sum}$.

Active Phase Modulations in Alignment Apparatuses

In some embodiments, phase modulation can be introduced in alignment apparatuses 700 and 800 without moving the stage 722 or incident beams on the alignment target 618 (i.e. without scanning the alignment target). As shown in FIGS. 7 and 8, phase modulator 740 at various locations in alignment apparatus 700 with on-axis illumination and in alignment apparatus 800 with off-axis illumination can be used, for example, phase modulators 740-1, 740-2, 740-3, 740-4, and/or 740-5.

In some embodiments, the phase modulator 740 can be a transmissive phase modulator covering half of the pupil plane where one of the optical branches of the light beam propagating through.

In a transmissive phase modulator, the phase of a light beam can be modulated by varying the birefringence of a material using an applied voltage or pressure. The transmissive phase modulator can include potassium dideuterium phosphate (KD*P) crystal, liquid crystal modulator (LCM), photo-elastic modulator (PEM) or electro optic modulator (EOM). For example, some KD*P crystals allow phase modulation in one polarization direction and no modulation in the orthogonal polarization direction.

In some embodiments, the phase modulator 740 can include two components applying different phase retardation as function of time. By applying two phase retardation components and modulating both of the optical branches of a light beam with different frequencies, the measured light intensity at detection system 728 can be less sensitive for background noises.

Figure 10B:
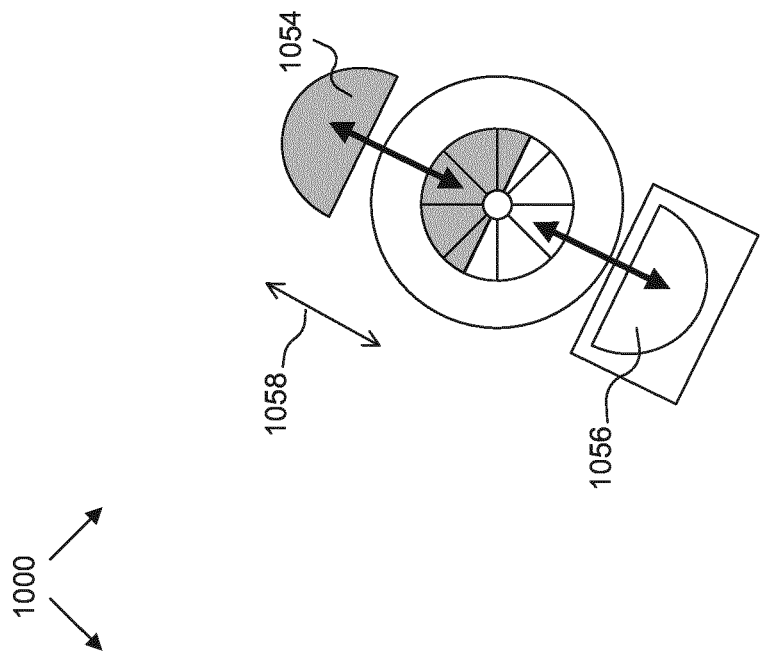
Figure 10A:
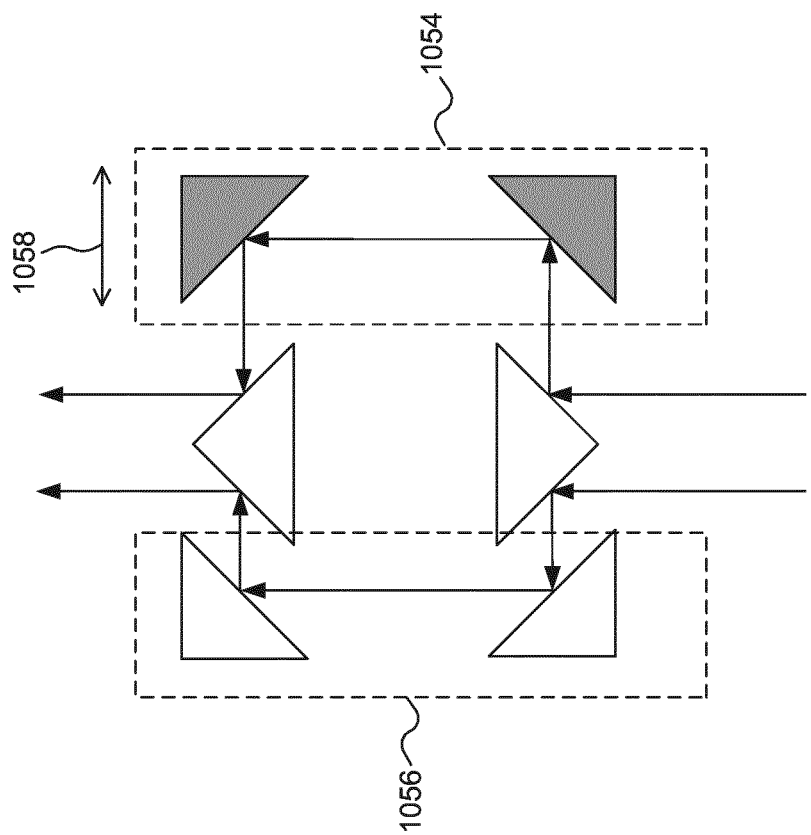

In some embodiments, the phase modulator 740 can also be a reflection based arrangement, for example a piezoelectric mirror assembly 1000 shown in FIGS. 10A (side view) and 10B (top view). The piezoelectric mirror assembly 1000 includes two arms 1054 and 1056 with reflective mirrors, wherein mirrors on one of the arms (e.g., arm 1054) can be moved by applying an electric voltage on a piezoelectric material, e.g., Lead Zirconate Titanate (PZT). In FIGS. 10A and 10B, arm 1054 can be moved along direction 1058, varying the optical path accordingly. In one example, when a light beam enters the piezoelectric mirror assembly 1000, the light beam is split into two optical branches which are directed onto arms 1054 and 1056 respectively. At the output of the piezoelectric mirror assembly 1000, the two optical branches of the light beam acquires an optical path difference and thereby a phase shift, wherein the phase shift depends on the electrical voltage applied on the PZT on the arm 1054. As described above, piezoelectric mirror assembly 1000 can be independent of the polarization state of light.

In some embodiments, the phase modulator 740-1 can be a binary amplitude spatial modulator, where a spatially (pixel based) applied voltage results in a local binary deflection or reflection of parts of the incident light beam. Examples of binary amplitude spatial modulator are ferroelectric liquid crystal (FLC), micro mirror array (MMA), etc. A ferroelectric liquid crystal is a chiral smectic liquid crystal which changes orientation under an electric field. By rotating the orientation of a polarized beam, a quarter-wave plate can be created using FLC. When implementing FLC with a beam analyzer, linear polarized light can pass or be reflected depending on the state of polarization. A Micro Mirror Array consists of pixels which can be manipulated through tilt and tip and/or with a piston. The piston can be used to locally induce a phase retardance, while the tip and tilt can be used to reflect a part of the incident beam. MMA can also be independent of the polarization state of light beam.

In some embodiments, the phase modulator 740 can be a digitized spatial light modulator (SLM), wherein the digitized SLM can modulate the phase of incident light beam independently for each pixel. The digitized SLM includes spatially nematic liquid crystals and micro-mirror arrays.

In some embodiments, the phase modulator 740 can be any combination of aforementioned phase modulators.

Referring back to FIGS. 7-9, depending on the location of the phase modulator 740 in the alignment apparatuses 700 and 800, light intensity measured at the detection system 728 can be different.

Active Phase Modulation using Phase modulator 740-1:

In some embodiments, the phase modulator 740-1 can be placed in the pupil plane between beam splitter 714 and the first polarizer 744. The phase modulator 740-1 can introduce phase shift δ between the positive and negative diffraction orders of the diffraction beams 719, and change the measured light intensity at detection system 728 to $$I_{sum} = 1 + \cos\left(\frac{4\pi x_0}{\Lambda} + \delta\right) \quad 6(a)$$

$$I_{diff} = 1 - \cos\left(\frac{4\pi x_0}{\Lambda} + \delta\right) \quad 6(b)$$

By modulating phase shift δ as a function of time (i.e., through active phase modulation to introduce temporal phase shift, e.g., φ(t)), a similar alignment signal can be created as moving the stage 722 or scanning the alignment target 618 (compared with Equation 4). From the measured light intensity, a position of the alignment target can be determined from grating shift $x_0$ through data or curving fitting.

Phase Modulation Using Phase Modulator 740-2:

In some embodiments, the phase modulator 740-2 can be placed between SRI 726 and phase compensator 750. Assuming the phase modulator 740-2 can introduce phase shift δ between the s-polarized and p-polarized components of the diffraction sub-beams 746-1 and 746-2 (see FIG. 9(3)), the measured light intensity at detection system 728 can be expressed as $$I_{sum} = 1 + \cos\left(\frac{4\pi x_0}{\Lambda}\right)\cos\delta \quad 7(a)$$

$$I_{diff} = 1 - \cos\left(\frac{4\pi x_0}{\Lambda}\right)\cos\delta \quad 7(b)$$

From Equations 7(a) and 7(b), the phase shift introduced by the phase modulator 740-2 changes the amplitude of the light intensity measured at the detection system 728 (i.e., changes depth of modulation), In general, modulation of the amplitude of light intensity alone does not provide desirable alignment information. However, the phase modulator 740-2 can be implemented in a combination with other form of modulation, for example, frequency modulation of the on-axis illumination beam 704 or off-axis illumination beams 806. Alignment using frequency modulation will be described in details in a subsequent session in the present disclosure.

Figure 10C:
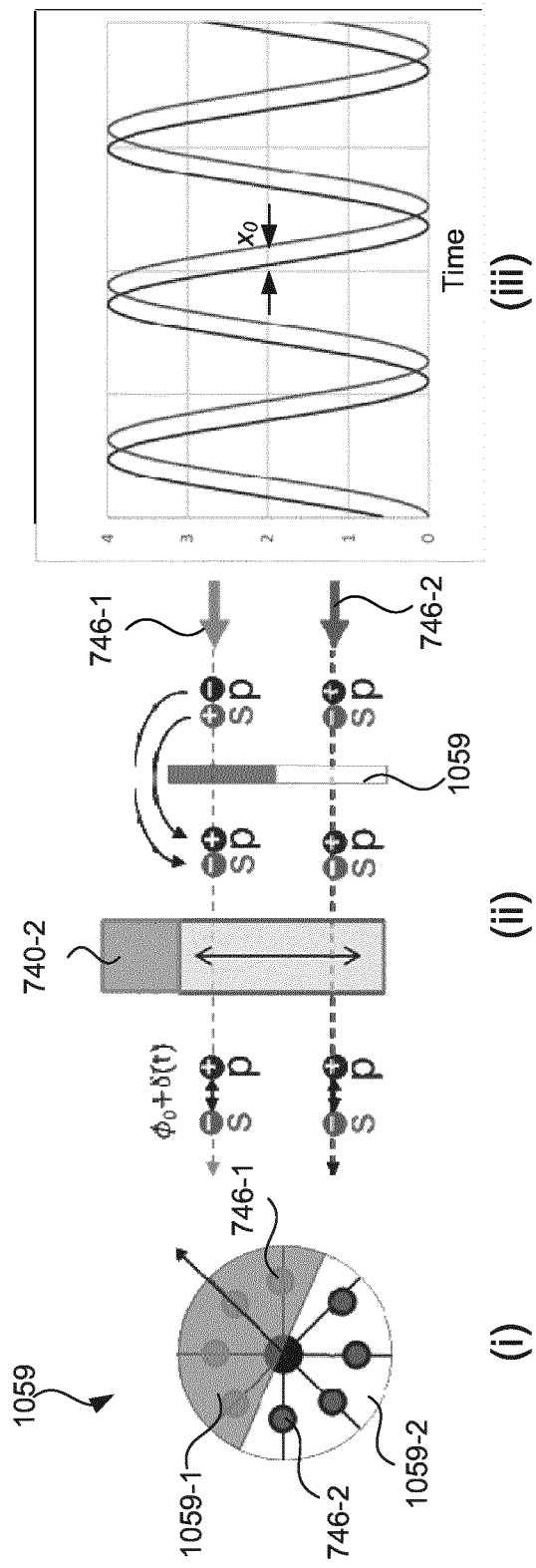

In some embodiments, a waveplate 1059 can be used in conjunction with the phase modulator 740-2 to introduce temporal phase shift φ(t) similar to the ones described in Equations 6(a) and 6(b). FIG. 10C illustrates an example of the waveplate 1059, according to some embodiments of the present disclosure.

In some embodiments, the waveplate 1059 can be placed in between the phase modulator 740-2 and the SRI 726 in FIGS. 7 and 8. As shown in FIG. 10C(ii), the waveplate 1059 can change polarization states of the positive and negative diffraction orders of the diffraction sub-beams (e.g., 746-1) for half pupil of the alignment apparatus. In this example, waveplate 1059 includes two portions. A portion 1059-2 is a crystal insensitive to polarization, and a portion 1059-1 is a λ/2 (half) wave-plate (HWP) with its fast axis (shown as an arrow in FIG. 10C(i)) oriented at 45° with respect to the p-polarization or s-polarization direction of the diffraction sub-beams (e.g., 746-1). In this example, the HWP 1059-1 can rotate polarization direction 90° with respect to the incident beam.

In some embodiments, the two portions of the waveplate 1059 can be rotated at an angle around propagation direction of the diffraction beams or diffraction sub-beams. For example, the portion 1059-1 can be rotated 22.5 degrees, as shown in FIG. 10C(i). In some embodiments, the portion 1059-1 can also be rotated 45 degrees depending on the fast axis orientation.

In some embodiments, as shown in FIG. 10C(i), the diffraction sub-beams 746-1 and 746-2 are located diametrically in the pupil plane of the waveplate 1059, i.e., they are 180° from each other around the center of the optical axis at the output of the SRI 726. In some embodiments, the diffraction sub-beams 746-1 and 746-2 correspond to the diffraction from the diffraction grating along x-direction of the alignment target 618 (see FIG. 6). FIG. 10C(i) also illustrates other diffraction sub-beams at the output of the SRI 726, corresponding diffraction gratings long other directions, for example, y-direction and in 45 degree angles.

In some embodiments, waveplate 1059 can be configured such that the diffraction sub-beam 746-1 irradiates onto the HWP portion 1059-1, and the diffraction sub-beams 746-2 irradiates onto the crystal portion 1059-2. Therefore at an output of waveplate 1059, positive and negative diffraction orders of the diffraction sub-beam 746-2 remain original polarization directions, however positive and negative diffraction orders of the diffraction sub-beam 746-1 change polarization direction to the opposite direction. As such, by using waveplate 1059, positive and negative diffraction orders of the diffraction sub-beams of 746-1 and 746-2 now have the same polarization directions and carry the same alignment signal as well.

By introducing a time dependent phase shift using the phase modulator 740-2 after the waveplate 1059, as shown in FIG. 10C(ii), an interference intensity can be detected and measured at the detection system 728. FIG. 10C(iii) illustrates an exemplary light intensity measured by the detection system 728, where the phase shift between the two oscillating curves corresponds to an alignment signal (e.g., the grating offset $x_o$).

Phase Modulation Using Phase Modulator 740-3:

In some embodiments, the phase modulators 740-3 can also be placed at the outputs of beam analyzer 730. In this example, each of the optical branches 748-1 and 748-2 (see FIG. 9(5)) can receive phase modulation independently through separate phase modulators 740-3.

Phase Modulation Using Phase Modulator 740-4:

In some embodiments, the phase modulators 740-4 can be placed at the input of the detection system 728, in front of apertures 760. The phase modulators 740-4 can control the region of interest (ROI) by selecting the area of alignment target to be measured. For example, the phase modulators 740-4 can be placed in front of the apertures 760 where an intermediate image plane is present. The detection system 728 measures the integrated signal over the image which as a whole is varying in intensity according to an induced phase modulation by moving the stage 722 (i.e. scanning the alignment target) or using the phase modulators 740-1, 740-2, 740-3, 740-5, etc. In this example, the phase modulator 740-4 can be a spatial light modulator, allowing light beams for certain area of the alignment target to pass and blocking other light beams. In this way it can be possible to accommodate small dimensions of the alignment target 618 without disturbance from surrounding structures. The ROI selection function works better when the alignment target 618 stands still during measurement, i.e., using phase modulators 740-1, 740-2, 740-3 or 740-5 to modulate light intensity.

Therefore, phase modulator 740-4 can selectively remove field areas in the image plane, making the system more robust against disturbing signals due to overfilling the alignment target with light beams of large spot size, more adaptive to the changes of the grating profile of the alignment target, and less sensitive to the design of the alignment target. A binary amplitude spatial modulator or a digitized SLM can be used for the phase modulator 740-4 for this purpose.

Phase Modulation on Off-Axis Illumination Beams:

In some embodiments, phase modulation of at least one of the off-axis illumination beams can also introduce intensity modulation at the detection system 728. For example, the phase modulator 740-5 can introduce phase shift δ on one branch of the off-axis illumination beams 806 in FIG. 8. In this example, the measured light intensity can also be expressed by Equations 6(a) and 6(b). However other optical configures can also produce phase modulation of the off-axis illumination beams 806.

Figure 11A:
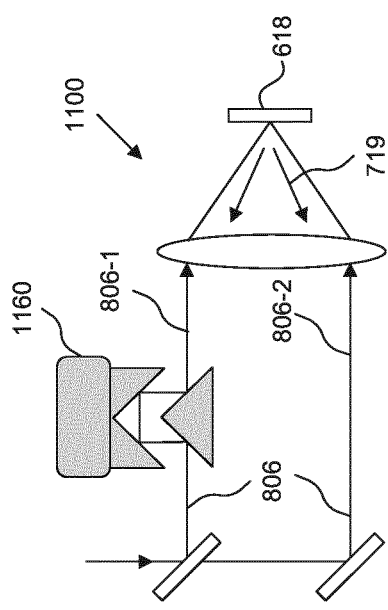

FIG. 11A illustrates an exemplary optical configuration 1100 for phase modulation of the off-axis illumination beams 806, according to some embodiments of the present disclosure. Phase modulation of an off-axis illumination beam 806-1 can be generated by a piezoelectric mirror arrangement 1160. The optical path of the off-axis illumination beam 806-1 can be modulated by applying an electric signal on the piezoelectric mirror arrangement 1160, creating a phase shift δ between the off-axis illumination beams 806-1 an 806-2. By varying the phase shift δ between the off-axis illumination beams 806-1 and 806-2 as a function of time, a temporal phase shift Δφ(t) can be introduced to the light intensity measured at the detection system 728, where the light intensity can be expressed by Equations 6(a) and 6(b).

Figure 11B:
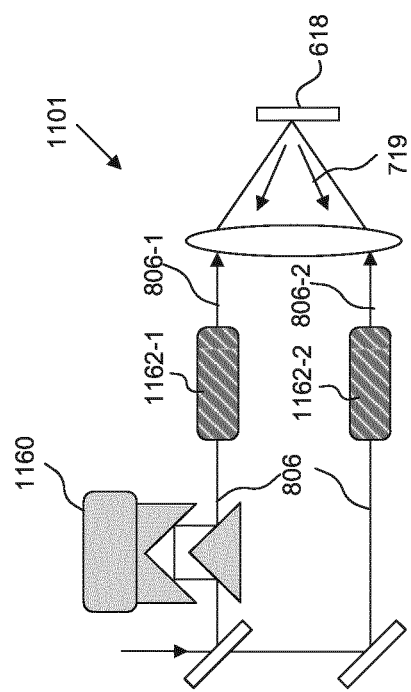

FIG. 11B illustrates another exemplary optical configuration 1101 for phase modulation of the off-axis illumination beams 806, according to some embodiments of the present disclosure. In this example, two transmissive phase modulators 1162-1 and 1162-2 are implemented on the off-axis illumination beams 806-1 and 806-2. In some embodiments, the transmissive phase modulators 1162-1 and 1162-2 can be a passive phase compensator, providing a fixed phase shift (in contrast to variable as a function of time) between the off-axis illumination beams 806-1 and 806-2. In some embodiments, the transmissive phase modulator 1162-2 can also provide active phase modulation for the off-axis illumination beam 806-2, with a different modulation frequency from the piezoelectric mirror arrangement 1160 on the off-axis illumination beam 806-1. In the other words, the off-axis illumination beams 806-1 and 806-2 can have phase modulations at two different frequencies. The transmissive phase modulators 1162-1 and 1162-2 can be liquid crystal modulators (LCMs), photo-elastic modulators (PEMs), electro optic modulators (EOMs), etc.

Figure 12A:
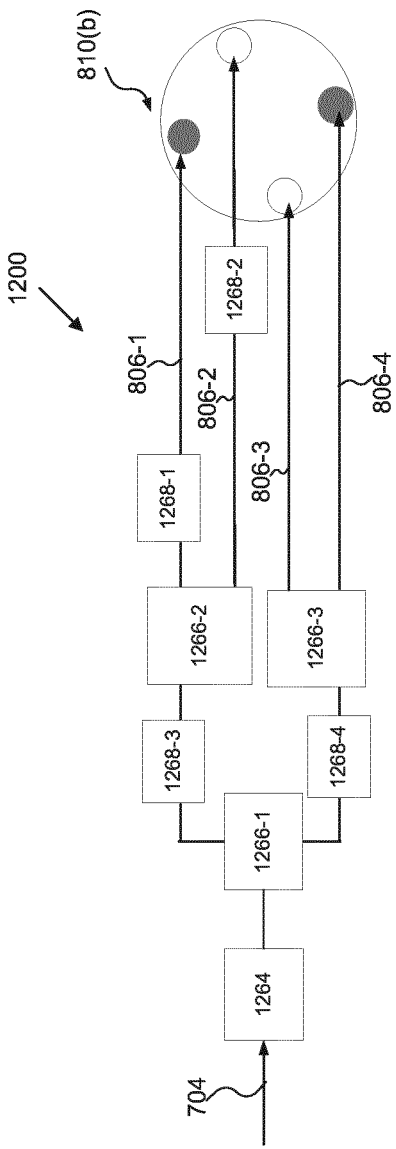
Figure 12B:
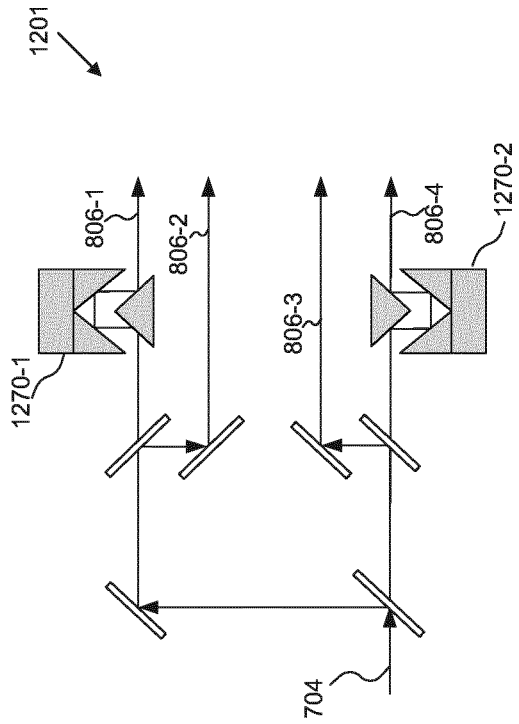

FIGS. 12A and 12B illustrate exemplary optical configurations 1200 and 1201 for off-axis illumination beams 806, according to some embodiments of the present disclosure. In this example, the off-axis illumination beams 806 have the illumination profile 810(b) of two pairs of illumination spots as described in FIG. 8. In FIG. 12A, on-axis illumination beam 704 propagates through an optional phase retarder 1264 and can be split into two optical branches at a beam splitter 1266-1, wherein each branch can be further split into two at beam splitters 1266-2 and 1266-3. The optical branches 806-1 and 806-4 of the off-axis illumination beams 806 (also referred to as off-axis illumination beams 806-1 and 806-4) correspond to one pair of illumination spots that are diametrically separated from each other, while optical branches 806-2 and 806-3 of the off-axis illumination beams 806 (also referred to as off-axis illumination beams 806-2 and 806-3) correspond to the other pair of illumination spots, also diametrically separated from each other. For each pair of illumination spots, one of the branches, for example 806-1 and 806-2, can be implemented with phase modulation through phase modulators 1268-1 and 1268-2 respectively. In FIG. 12A, optional phase modulators 1268-3 and 1268-4 can be implemented between beam splitters 1266-1 and 1266-2, and between beam splitters 1266-1 and 1266-3. Optional phase modulators 1268-3 and 1268-4 can provide passive phase compensation or active phase modulation between the two pairs of optical branches. In FIG. 12B piezoelectric mirror arrangements 1270-1 and 1270-2 are used as phase modulators on optical branches 806-1 and 806-4 respectively, wherein optical branches 806-1 and 806-4 correspond to different pairs of the illumination spots of the illumination profile 810(b).

Referring back to FIG. 12A, in some embodiments, phase modulators 1268-1, 1268-2, 1268-3 and 1268-4 can be similar to the phase modulators 740 and can also include transmissive phase modulators such as KD*P crystals, LCMs, PEMs, EOMs, etc. In some embodiments, the phase modulators 1268-1, 1268-2, 1268-3 and 1268-4 can be PZT mirror assemblies, or binary amplitude spatial modulators, such as FLCs or MMAs. In some embodiments, the phase modulators 1268-1, 1268-2, 1268-3 and 1268-4 can be digitized SLMs, or any combination of aforementioned modulators.

In some embodiments, the phase modulators 1268-3 and 1268-4 can be replaced by frequency modulators to provide separate frequency modulations for the optical branches 806. The details of frequency modulation will be described in detail in a subsequent session herein.

Figure 13:
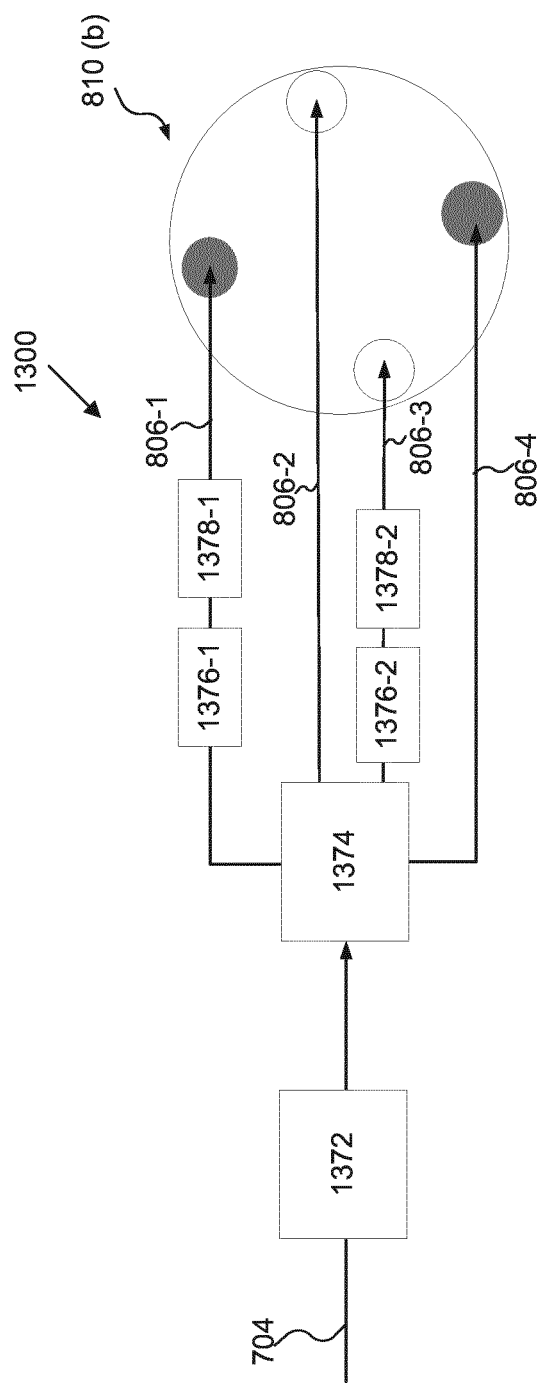

FIG. 13 illustrates an optical configuration 1300 to provide phase modulation for off-axis illumination beams 806, according to some embodiments of present disclosure. The off-axis illumination beams 806 have the illumination profile 810(*b*) with two pairs of illumination spots in a pupil plane. In this example, on-axis illumination beam 704 can be unpolarized. Polarization phase retarder 1372 can convert illumination beam 704 to a polarized illumination and induce a phase shift between s-polarization and p-polarization components. Optical configuration 1300 also includes a four-way beam splitter 1374, wherein the four-way beam splitter 1374 can split illumination beam 704 into four optical branches 806-1, 806-2, 806-3 and 806-4. In this example, optical branches 806-1 and 806-3 can have s-polarization, while optical branches 806-2 and 806-4 can have p-polarization.

In FIG. 13, the optical configuration 1300 can also include phase modulators 1376-1 and 1376-2. In some embodiments, phase modulator 1376-1 can provide phase modulation for optical branch 806-1 and phase modulator 1376-2 can provide phase modulation for optical branch 806-3. Phase modulator 1376-1 and 1376-2 can be similar to the phase modulators 740 and can include similar optical devices. In some embodiment, phase modulator 1376-1 and 1376-2 can be a KD*P crystal, allowing separation of s-polarization and p-polarization by applying different modulation frequencies.

In FIG. 13, the optical configuration 1300 can further include phase compensators 1378-1 and 1378-2 to adjust phase shift between optical branches 806-1 and 806-4, and between optical branches 806-2 and 806-3, respectively. It is not limited to the scope of this disclosure that the phase compensators 1378-1 and 1378-2 can also actively modulate the phase of the light beams. In some embodiments, the phase compensators 1378-1 and 1378-2 can be placed on the optical branches 806-1 and 806-3, respectively, as shown in FIG. 13. In some embodiments, the phase compensators 1378-1 and 1378-2 can also be placed on the optical branches 806-2 and 806-4, respectively. The phase compensators 1378-1 and 1378-2 can be similar to the phase modulators 1376-1 and 1376-2 and can include similar optical devices.

In the optical configuration 1300 in FIG. 13, in some embodiments, each illumination spots of the illumination profile 810(*b*) can have two orthogonally polarized beams. For example, the optical branch 806-1 is s-polarized and optical branch 806-4 is p-polarized, or vice versa. Similarly the optical branch 806-2 is s-polarized and optical branch 806-3 is p-polarized, or vice versa. In some embodiments, each illumination spots of the illumination profile 810(*b*) can have one linearly polarized beam and one un-polarized beam. Phase modulators 1376-1 and 1376-2 and phase compensators 1378-1 and 1378-2 can be configured to modulate polarized and un-polarized light beams.

Detecting Alignment Position in X- and V-Directions Simultaneously

In some embodiments, alignment position of the two-dimensional alignment target 618 (shown in FIG. 6) can be determined in x- and y-directions simultaneously by using a phase modulator, for example, the phase modulator 740-1 in alignment apparatuses 700 and 800 in FIGS. 7 and 8. The alignment target 618 can be placed stationary in the alignment apparatuses 700 or 800. In this example, the alignment target 618 can have diffraction gratings with different period in x- and y-directions, e.g., the diffraction gratings running parallel to x-axis can have period $\Lambda_x$ and the diffraction gratings running parallel to y-axis can have period $\Lambda_y$, wherein $\Lambda_x \neq \kappa_y$. According to Equations 6(a) and 6(b), the light intensity measured at the detection system 728 depends on the period of the diffraction grating A. As such, the measured light intensity can include two different frequencies, which can be discriminated or de-multiplexed to determine the alignment positions in x- and y-directions for alignment target 618.

In some embodiments, on-axis illumination beam 704 of aligmnent apparatus 700 (in FIG. 7) and/or off-axis illumination beams 806 of alignment apparatus 800 (in FIG. 8) can be used to detect alignment positions in both x- and y-directions simultaneously by using the two-dimensional alignment target 618 in FIG. 6. Through scanning the alignment target 618 at an oblique angle with the diffraction gratings, induced frequency difference Δv between the positive and negative diffraction orders of the diffraction beams 719 call be generated in separately in x- and y-directions in Equations (3), i.e., $$\Delta v_x = \frac{V_{stage,x}}{\Lambda} \text{ and } \Delta v_y = \frac{V_{stage,y}}{\Lambda},$$

wherein $V_{stage,x}$ and $V_{stage,y}$ are the components of stage scanning speed along x- and y-directions. Similarly, the measured light intensity can include two different frequencies, which can be discriminated or de-multiplexed to determine the alignment positions in x- and y-directions for alignment target 618.

In some embodiments, the illumination profile 810(*b*) with two pairs of illumination spots (as shown in FIGS. 8, 12A, 12B and 13) can be used to simultaneously determine the alignment position in both x- and y-directions for the alignment target 618 with two-dimensional diffraction gratings in FIG. 6. In this example, one pair of the illumination spots can be used to detect alignment position in x-direction and the other pair can be used to detect alignment position in y-direction. For example, in FIG. 12A, 12B or 13, by modulating the off-axis illumination beams 806-1 and 806-4 at one frequency and modulating the off-axis illumination beams 806-2 and 806-3 at a different frequency, alignment position in x- and y-direction can be detected simultaneously for the alignment target 618.

In some embodiments, the phase modulator 740-1, 740-2 or 740-3 in alignment apparatuses 700 and 800 in FIGS. 7 and 8 can introduce phase modulation to only one diffraction order (e.g., m=±1) of the diffraction beams 719. In some embodiments, the phase modulator 740-1 can introduce different phase modulations to two diffraction orders (e.g., m=±1 and +2) of the diffraction beams 719. In this example, one diffraction order (e.g., m=±1) of the diffraction beams can provide alignment position information in x-direction while the other diffraction order (e.g., m=±2) of the diffraction beams can provide alignment position information in y-direction. For example, a nematic spatial phase modulator can provide function described herein.

In some embodiments, the phase modulator 740-3 in alignment apparatuses 700 and 800 in FIGS. 7 and 8 can allow specific diffraction orders to pass through onto the optical branches 748-1 and 748-2. Alignment position in x- and y-direction can thereby be determined simultaneously by using the phase modulator 740-3 in addition to scanning the alignment target 618. For example, phase modulation of the optical branches 748-1 and 748-2 generated by the phase modulator 740-3 can add constructively in x-direction with phase modulation induced by the scanning of the alignment target 618. Similarly phase modulation can add deconstructively in y-direction with phase modulation induced by the scanning of the alignment target 618. In this example, two distinctly modulated frequencies can be measured independently for x- and y-directions and can be separated by signal analysis.

Detecting Alignment Position in X- and Y-Directions Sequentially

In some embodiments, alignment position in x- and y-directions of the two-dimensional alignment target 618 can be determined sequentially. For example, by using the off-axis illumination beams 806 with illumination profile 810(b) in FIG. 8, each pair of the illumination spots can provide alignment information from gratings along either x-direction or y-direction depending on the scanning direction of the alignment target 618. In this example, light intensity measured at the detection system 728 is modulated by scanning the two-dimensional alignment target 618.

In some embodiments, the two pairs of the illumination spots of the off-axis illumination beams 806 can be modulated by the phase modulator 740-5 in FIG. 8, or more specifically, by the phase modulators 1268-1 and 1268-2 in FIG. 12A, 1270-1 and 1270-2 in FIG. 12B, or 1376-1 and 1376-2 in FIG. 13. In some embodiments, one pair of the illumination spots can be s-polarized and the other pair can be p-polarized. By adjusting the incident angle and orientation of the diffraction gratings of the alignment target 618, gratings along x-direction can diffract one pair of illumination spots only and gratings along y-direction can diffract the other pair only. As such, overfilling the alignment target 618 with larger illumination spots can be feasible. By sequentially modulating each pair of the illumination spots, alignment position in x- and y-directions can be determined separately.

In some embodiments, phase modulators 740-1, 740-2 or 740-3 in FIGS. 7 and 8 can be used to select the specific diffraction orders of the diffraction beams 719, the diffraction sub-beams 746 or optical branches 748. In this example, the diffraction orders corresponding to alignment position of x- or y-directions of the alignment target 618 can be selected individually. The alignment position of x- and y-directions can therefore be determined sequentially. In this example, a binary amplitude modulator can be used.

In some embodiments, phase modulator 740-4 in FIGS. 7 and 8 can be used to select the regions of interest (ROI) from the image plane in front of the aperture 760 to detect a specific direction of the alignment target 618 (e.g., gratings running along x-axis). Both x- and y-directions of the alignment position can thus be measured after each other.

Figure 14B:
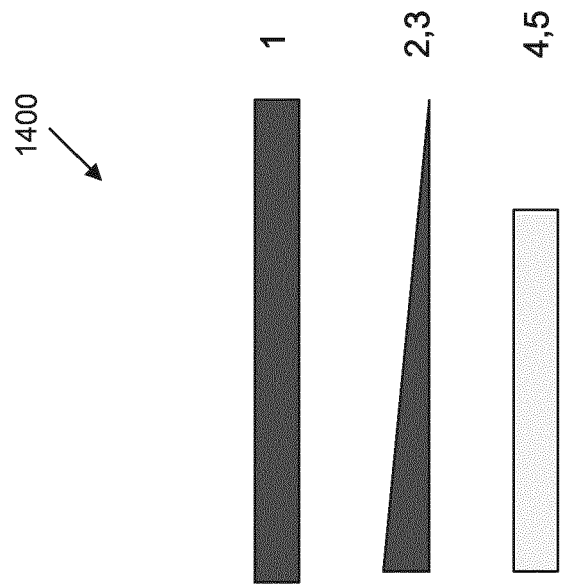
Figure 14A:
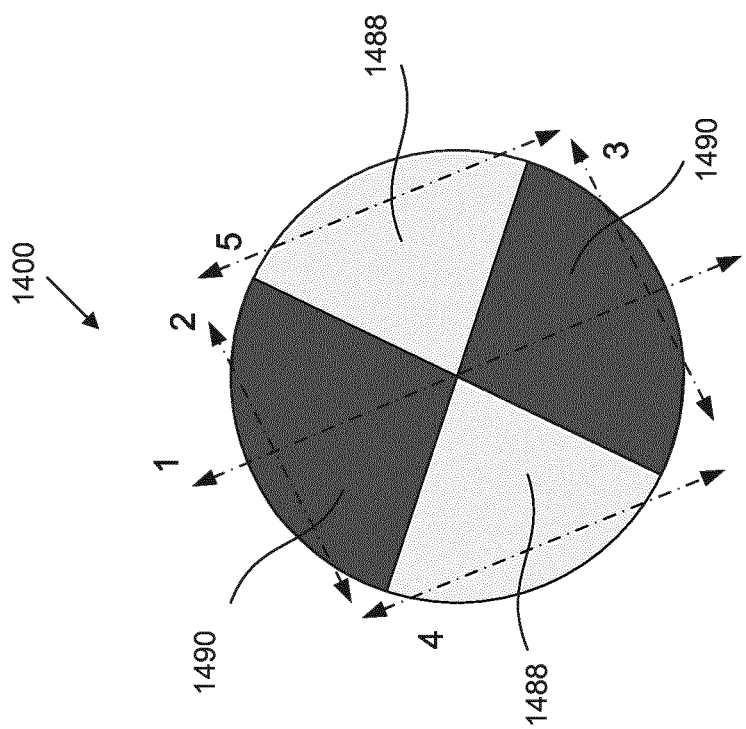

FIGS. 14A and 14B illustrate a respective top-down and cross-sectional views of a beam splitter 1400, according to some embodiments of the present disclosure. The beam splitter 1400 can be implemented in place of phase modulator 740-4 that can select ROI in the image plane in front of the aperture 760 in the alignment apparatuses 700 and 800.

From the top-down view in FIG. 14A, the beam splitter 1400 includes two regions, a transmissive region 1488 and a deflective region 1490, The transmissive region 1488 and the deflective region 1490 each includes two diametrically opposite quadrants. The cross-sessions along lines 1, 4 and 5 show a uniform thickness, while the cross-sections along lines 2 and 3 resemble wedge plates, i.e., one end is much thicker than the other end. The wedge plate structure of the beam splitter 1400 allows to deflect certain components of the diffraction sub-beams 748 onto a field outside the aperture 760. The deflected components of the diffraction sub-beams 748 can be x-, y- or oblique rotated diffraction orders when placed at 22.5 degrees from the optical axis. The exemplary design of uniform thickness in transmissive region 1488 allows easy fitting for fiber optics. In some embodiments, the transmissive region 1488 can also be designed like a wedge plate to decrease the impact of telecentricity.

In some embodiments, the beam splitter 1400 can include two regions, an absorption region (opaque) and a transmissive region (open), wherein the absorption region can be made from an absorbing material at the wavelength of the illumination beams in the alignment apparatuses 700 and 800. The absorption and transmissive regions can also include two diametrically opposite quadrants. Such a design can allow to determine alignment position in x-direction based on light intensity measurement of $I_{sum}$ and y-direction based on light intensity measurement of $I_{diff}$.

In some embodiments, wedge angles of the deflective region 1490 of the beam splitter 1400 can be optimized to decrease the impact of telecentricity. For example, the wedge angle of the deflective region 1900 can be zero (uniform thickness) in one quadrant and any non-zero angle (wedge plate) in the other quadrant.

Detecting Alignment Position at a High Speed

In some embodiments, phase modulation by a spatial phase modulator, for example the modulator 740-1 or 740-5, can be implemented in conjunction with phase modulation by scanning the alignment target 618. By using the phase modulator 740-1 or 740-5, light intensity measured at the detection system 728 can be modulated at an effective frequency lower than the modulation frequency Δν induced by the speed $V_{stage}$ of the moving stage 722. In this example, the positive and negative diffraction orders of the diffraction beams 719 experience an increase or decrease of frequency Δν depending on the moving direction of the stage 722. In some embodiments, the phase modulation from the phase modulator 740-1 or 740-5 can counteract Δν from the moving stage 722. As such, while the stage 722 can move at a high speed and the alignment target 618 can be scanned at a high speed, the position of the alignment target 618 can be determined at a relatively low frequency.

Depth Of Modulation (DOM) of an Alignment Apparatus

A spatially controllable reflector can deflect a portion of a light beam that is not of interest. In some embodiments, in the alignment apparatuses 700 and 800 in FIGS. 7 and 8, phase modulators, for example, phase modulator 740-1, 740-2 and 740-3, can filter out portions of the diffraction beams 719, diffraction sub-beams 746 and optical branches 748 that do not contribute to the alignment signal of the alignment target 618. Only the diffraction orders which are expected from the alignment target 618 are selected and can propagate through. This function will therefore increase the depth of modulation (DOM) of the alignment apparatuses 700 and 800, allowing to detect alignment signals at a lower signal-to-noise levels.

An example of the phase modulator 740-3 that can increase DOM includes a spatial ferroelectric liquid crystal on silicon (FLCoS). After beam analyzer 730, sensitivity for temperature induced variations from FLCoS is less relevant to the determination of the alignment position of the alignment target 618. In some embodiments, a micro mirror array (MMA) can be used for phase modulator 740-1, 740-2 or 740-3 to increase DOM.

Alignment Apparatus with Frequency Modulation

As described in Equation (3), the temporal phase shift $\Delta\varphi(t)$ in Equation (4) can be generated by scanning the alignment target 618 or moving the stage 722 in FIGS. 7 and 8.

Figure 15A:
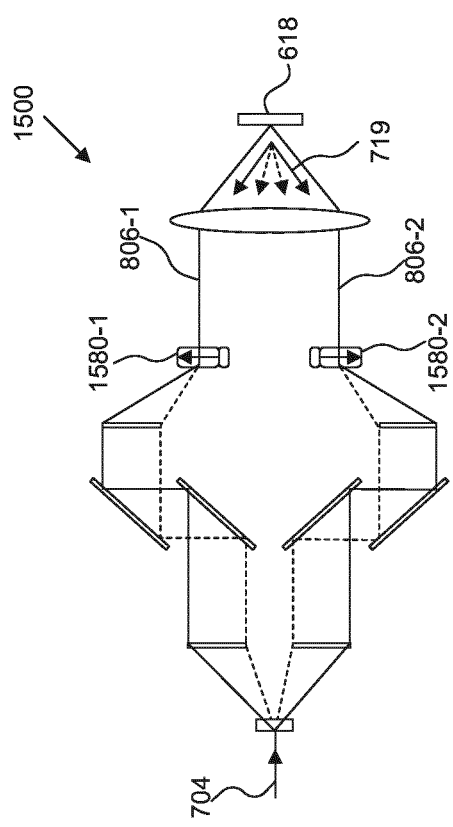
Figure 15B:
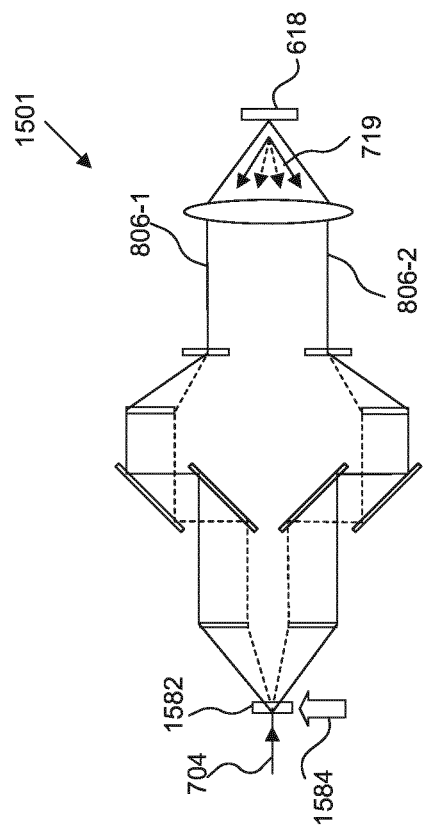

FIGS. 15A and 15B illustrate exemplary optical configurations 1500 and 1501, according to some embodiments of the present disclosure. In some embodiments, the temporal phase shift $\Delta\varphi(t)$ can also be generated by frequency modulation, for example, through acousto-optic modulators (AOMs) 1580-1 and 1580-2 in FIG. 15A. In this example, off-axis illumination beams 806-1 and 806-2 are modulated by AOMs 1580-1 and 1580-2, respectively. The temporal phase shift $\Delta\varphi(t)$ can thereby be expressed as $$\Delta\varphi(t) = 2\pi\Delta\nu_{AOM}t \quad (8)$$

wherein $\Delta\nu_{AOM}$ is the frequency difference between AOMs 1580-1 and 1580-2.

In some embodiments, the temporal phase shift $\Delta\varphi(t)$ can be generated by scanning an internal grating 1582, as shown in FIG. 15B. In this example, the off-axis illumination beams 806-1 and 806-2 are diffracted light from the internal grating 1582. By scanning the internal grating 1582 along a scanning direction 1584, a frequency difference $\Delta\nu_{grating}$ can be introduced between the off-axis illumination beams 806-1 and 806-2. The frequency difference and the temporal phase shift $\Delta\varphi(t)$ can thereby be expressed as $$\Delta\nu_{grating} = 2\frac{V_{grating}}{P} \quad 9(a)$$

$$\Delta\varphi(t) = 2\pi\Delta\nu_{grating}t \quad 9(b)$$

wherein p and $V_{grating}$ represent the period and scanning speed of the internal grating 1582.

Figure 16:
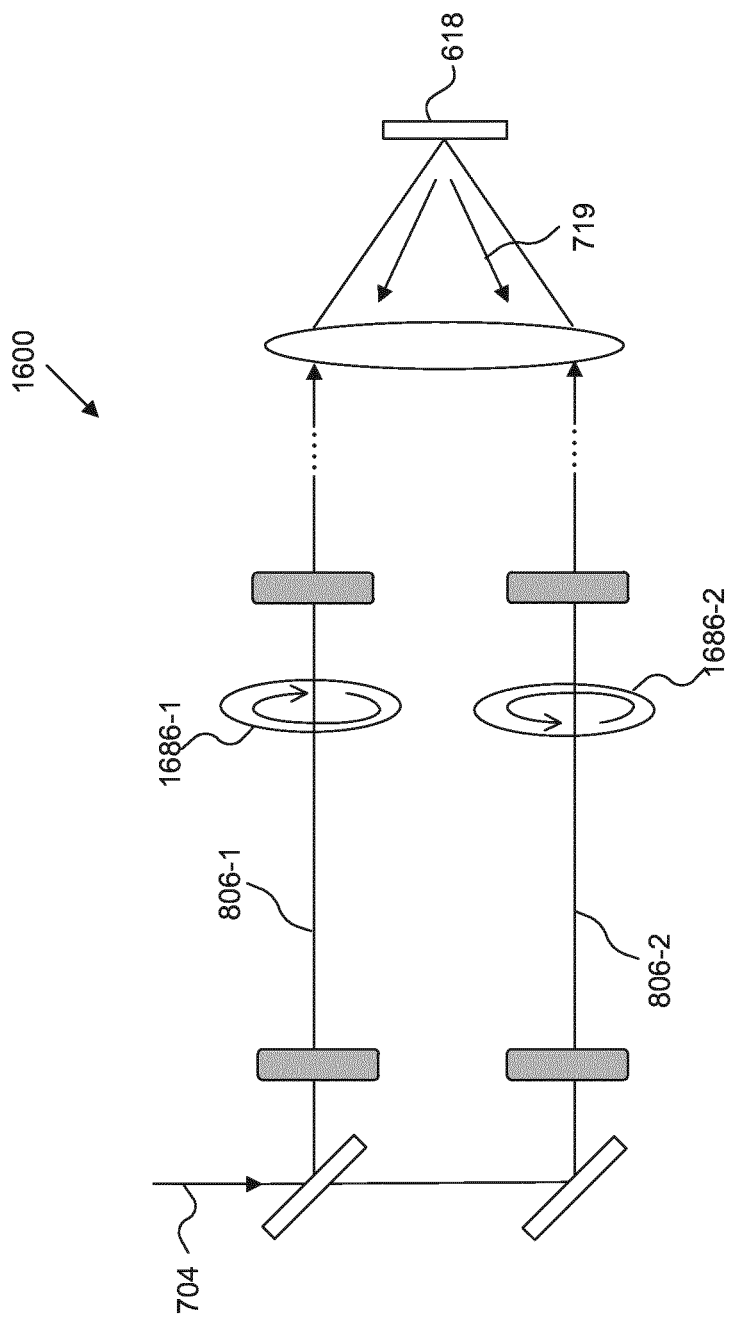

FIG. 16 illustrates an exemplary optical configuration 1600, according to some embodiments of the present disclosure. In some embodiments, frequency modulation can also be introduced by rotating polarizers 1686-1 and 1686-2. For example, frequency difference between the off-axis illumination beams 806-1 and 806-2 can be generated through a clock-wise rotating polarizer 1686-1 and a counter-clock wise rotating polarizer 1686-2. Assuming the rotating speed is $\Omega$, the frequency difference $\Delta\nu_{rot}$ and the temporal phase shift $\Delta\varphi(t)$ can thereby be expressed as $$\Delta\nu_{rot} = 2\Omega \quad 9(a)$$

$$\Delta\varphi(t) = 2\pi\Delta\nu_{rot}t \quad 9(b)$$

Other aspects of the invention are set out in the following numbered clauses.

1. An alignment apparatus, comprising:
an illumination system configured to produce one or more illumination beams, direct the one or more illumination beams toward an alignment target and receive one or more diffraction beams reflected from the alignment target, wherein the one or more diffraction beams comprise at least one positive diffraction order or one negative diffraction order;

a self-referencing interferometer configured to receive the one or more diffraction beams, and generate diffraction sub-beams, wherein the diffraction sub-beams are orthogonally polarized, rotated 180 degrees with respect to each other around an alignment axis, and spatially overlapped;

a beam analyzer configured to generate interference intensity between overlapped components of the diffraction sub-beams and produce two orthogonally polarized optical branches; and a detection system configured to determine a position of the alignment target based on light intensity measurement of the optical branches, wherein the measured light intensity is modulated by a phase modulator.

2. The alignment apparatus of clause 1, wherein the illumination system is further configured to produce off-axis illumination beams at first and second positions diametrically opposite to one another in a pupil plane.

3. The alignment apparatus of clause 2, wherein the off-axis illumination beam is modulated by the phase modulator.

4. The alignment apparatus of clause 1, wherein the phase modulator modulates the positive or negative diffraction order of the diffraction beams reflected from the alignment target.

5. The alignment apparatus of clause 1, wherein the phase modulator modulates the optical branches produced by the beam analyzer.

6. The alignment apparatus of clause 1, wherein the phase modulator modulates an image of the alignment target at an input to the detection system.

7. The alignment apparatus of clause 1, wherein the phase modulator is a piezoelectric mirror assembly that produces phase modulation by applying an electric signal on a piezoelectric material.

8. The alignment apparatus of clause 1, wherein the phase modulator comprises a liquid crystal modulator, a photoelastic modulator, an electro-optic modulator, a ferroelectric liquid crystal, a micro mirror array or a digitized spatial light modulator.

9. The alignment apparatus of clause 8, wherein the liquid crystal modulator is a potassium dideuterium phosphate (KD*P) crystal.

10. The alignment apparatus of clause 1, wherein the phase modulator comprises a waveplate covering half of the pupil plane to change polarization states of the positive and negative diffraction orders.

11. The alignment apparatus of clause 1, wherein the phase modulator comprises a transmissive and a deflective region, wherein each region comprises two diametrically opposite quadrants, and the deflective region is wedge shaped with a varying thickness.

12. The alignment apparatus of clause 1, wherein the phase modulator produces frequency modulation of an off-axis illumination beam.

13. The alignment apparatus of clause 12, wherein the phase modulator is an acousto-optic modulator.

14. The alignment apparatus of clause 12, wherein the phase modulator is an internal grating and the frequency modulation of the off-axis illumination beam is produced by scanning the internal grating.

15. The alignment apparatus of clause 12, wherein the phase modulator is a half-wave plate and the frequency modulation of the off-axis illumination beam is produced by rotating the half-wave plate.

16. A lithographic apparatus comprising:
   an illumination system configured to illuminate a patterning device;
   a projection system configured to project an image of the patterning device onto a wafer; and
   an alignment system comprising:
   an illumination system configured to produce one or more illumination beams, direct the one or more illumination beams toward an alignment target and receive one or more diffraction beams reflected from the alignment target, wherein the one or more diffraction beams comprise at least one positive diffraction order or one negative diffraction order;
   a self-referencing interferometer configured to receive the one or more diffraction beams, and generate diffraction sub-beams, wherein the diffraction sub-beams are orthogonally polarized, rotated 180 degrees with respect to each other around an alignment axis, and spatially overlapped;
   a beam analyzer configured to generate interference intensity between overlapped components of the diffraction sub-beams and produce two orthogonally polarized optical branches; and
   a detection system configured to determine a position of the alignment target based on light intensity measurement of the optical branches, wherein the measured light intensity is modulated by a phase modulator.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An alignment apparatus, comprising:
   an illumination system configured to produce one or more illumination beams, direct the one or more illumination beams toward an alignment target and receive one or more diffraction beams reflected from the alignment target, wherein the one or more diffraction beams comprise at least one positive diffraction order or one negative diffraction order;
   a self-referencing interferometer configured to receive the one or more diffraction beams, and generate diffraction sub-beams, wherein the diffraction sub-beams are orthogonally polarized, rotated 180 degrees with respect to each other around an alignment axis, and spatially overlapped;
   an optical element configured to generate interference intensity between overlapped components of the diffraction sub-beams and produce two orthogonally polarized optical branches; and
   a detection system configured to determine a position of the alignment target based on a light intensity measurement of the optical branches, wherein the measured light intensity is modulated by a phase modulator, and wherein the phase modulator comprises:
      a waveplate covering half of a pupil plane to change polarization states of the positive and negative diffraction orders,
      a transmissive and a deflective region, wherein each region comprises two diametrically opposite quadrants, and the deflective region is wedge shaped with a varying thickness,
      an internal grating to produce frequency modulation of an off-axis illumination beam by scanning the internal grating, or
      a half-wave plate to produce frequency modulation of an off-axis illumination beam by rotating the half-wave plate.

2. The alignment apparatus of claim 1, wherein the illumination system is further configured to produce off-axis illumination beams at first and second positions diametrically opposite to one another in a pupil plane.

3. The alignment apparatus of claim 2, wherein the off-axis illumination beams are modulated by the phase modulator.

4. The alignment apparatus of claim 1, wherein the phase modulator modulates the positive or negative diffraction order of the diffraction beams reflected from the alignment target.

5. The alignment apparatus of claim 1, wherein the phase modulator modulates the optical branches produced by the optical element.

6. The alignment apparatus of claim 1, wherein the phase modulator modulates an image of the alignment target at an input to the detection system.

7. The alignment apparatus of claim 1, wherein the phase modulator is a piezoelectric mirror assembly that produces phase modulation by applying an electric signal on a piezoelectric material.

8. The alignment apparatus of claim 1, wherein the phase modulator comprises a liquid crystal modulator, a photo-elastic modulator, an electro-optic modulator, a ferroelectric liquid crystal, a micro mirror array or a digitized spatial light modulator.

9. The alignment apparatus of claim 8, wherein the liquid crystal modulator is a potassium dideuterium phosphate (KD*P) crystal.

10. The alignment apparatus of claim 1, wherein the phase modulator is an acousto-optic modulator.

11. A lithographic apparatus comprising:
    an illumination system configured to illuminate a patterning device;
    a projection system configured to project an image of the patterning device onto a wafer; and
    an alignment system comprising:
       an illumination system configured to produce one or more illumination beams, direct the one or more illumination beams toward an alignment target and receive one or more diffraction beams reflected from the alignment target, wherein the one or more diffraction beams comprise at least one positive diffraction order or one negative diffraction order;
       a self-referencing interferometer configured to receive the one or more diffraction beams, and generate diffraction sub-beams, wherein the diffraction sub-beams are orthogonally polarized, rotated 180 degrees with respect to each other around an alignment axis, and spatially overlapped;
       an optical element configured to generate interference intensity between overlapped components of the diffraction sub-beams and produce two orthogonally polarized optical branches; and
       a detection system configured to determine a position of the alignment target based on light intensity measurement of the optical branches, wherein the measured light intensity is modulated by a phase modulator, and wherein the phase modulator comprises:
          a waveplate covering half of a pupil plane to change polarization states of the positive and negative diffraction orders,
          a transmissive and a deflective region, wherein each region comprises two diametrically opposite quadrants, and the deflective region is wedge shaped with a varying thickness,
          an internal grating to produce frequency modulation of an off-axis illumination beam by scanning the internal grating, or
          a half-wave plate to produce frequency modulation of an off-axis illumination beam by rotating the half-wave plate.

12. The lithographic apparatus of claim 11, wherein the illumination system is further configured to produce off-axis illumination beams at first and second positions diametrically opposite to one another in the pupil plane.

13. The lithographic apparatus of claim 12, wherein the off-axis illumination beams are modulated by the phase modulator.

14. The lithographic apparatus of claim 11, wherein the phase modulator modulates the positive or negative diffraction order of the diffraction beams reflected from the alignment target.

15. The lithographic apparatus of claim 11, wherein the phase modulator modulates the optical branches produced by the optical element.

16. The lithographic apparatus of claim 11, wherein the phase modulator modulates an image of the alignment target at an input to the detection system.

17. The lithographic apparatus of claim 11, wherein the phase modulator is a piezoelectric mirror assembly that produces phase modulation by applying an electric signal on a piezoelectric material.

18. The lithographic apparatus of claim 11, wherein the phase modulator comprises a liquid crystal modulator, a photo-elastic modulator, an electro-optic modulator, a ferroelectric liquid crystal, a micro mirror array or a digitized spatial light modulator.

19. The lithographic apparatus of claim 18, wherein the liquid crystal modulator is a potassium dideuterium phosphate (KD*P) crystal.

20. The lithographic apparatus of claim 11, wherein the phase modulator is an acousto-optic modulator.

* * * * *

UNITED STATES PATENT AND TRADEMARK OFFICE
CERTIFICATE OF CORRECTION

| | | |
|---|---|---|
| PATENT NO. | : 11,803,130 B2 | Page 1 of 1 |
| APPLICATION NO. | : 17/633884 | |
| DATED | : October 31, 2023 | |
| INVENTOR(S) | : Bijnen et al. | |

It is certified that error appears in the above-identified patent and that said Letters Patent is hereby corrected as shown below:

On the Title Page

Column 2, item (57), Under "ABSTRACT", Line 5, delete "Interferometer" and insert -- interferometer --, therefor.

In the Specification

In Column 2, Line 29, delete "minor" and insert -- mirror --, therefor.

In Column 4, Line 5, delete "Willis" and insert -- terms --, therefor.

In Column 4, Line 37, delete "flit aware," and insert -- firmware, --, therefor.

In Column 5, Line 35, delete "allay" and insert -- array --, therefor.

In Column 12, Line 20, delete "(boned" and insert -- formed --, therefor.

In Column 24, Line 4, delete "V-Directions" and insert -- Y-Directions --, therefor.

In Column 24, Line 26, delete "aligmnent" and insert -- alignment --, therefor.

In Column 24, Line 33, delete "call" and insert -- can --, therefor.

In Column 25, Line 49, delete "deteimined" and insert -- determined --, therefor.

In the Claims

In Column 32, Claim 11, Line 40, after "on" insert -- a --.

Signed and Sealed this
Twenty-sixth Day of December, 2023

Katherine Kelly Vidal
*Director of the United States Patent and Trademark Office*